US012354679B2

United States Patent
Fujimori et al.

(10) Patent No.: US 12,354,679 B2
(45) Date of Patent: Jul. 8, 2025

(54) MEMORY SYSTEM FOR PERFORMING AN ERASE VOLTAGE APPLICATION OPERATION AND AN ERASE VERIFY OPERATION FOR A NONVOLATILE MEMORY

(71) Applicant: Kioxia Corporation, Tokyo (JP)

(72) Inventors: Takumi Fujimori, Yamato (JP); Tetsuya Sunata, Yokohama (JP); Masanobu Shirakawa, Chigasaki (JP); Hidehiro Shiga, Yokohama (JP)

(73) Assignee: Kioxia Corporation, Tokyo (JP)

( * ) Notice: Subject to any disclaimer, the term of this patent is extended or adjusted under 35 U.S.C. 154(b) by 46 days.

(21) Appl. No.: 18/179,505

(22) Filed: Mar. 7, 2023

(65) Prior Publication Data

US 2023/0395167 A1    Dec. 7, 2023

(30) Foreign Application Priority Data

Jun. 7, 2022    (JP) ................................. 2022-092347

(51) Int. Cl.
  *G11C 16/04*  (2006.01)
  *G11C 16/16*  (2006.01)
  *G11C 16/34*  (2006.01)

(52) U.S. Cl.
  CPC .......... *G11C 16/3445* (2013.01); *G11C 16/16* (2013.01)

(58) Field of Classification Search
  CPC . G11C 16/3445; G11C 16/16; G11C 16/0483; G11C 16/32
  USPC .................................................... 365/185.22
  See application file for complete search history.

(56) References Cited

U.S. PATENT DOCUMENTS

| | | | |
|---|---|---|---|
| 6,735,116 B2 | 5/2004 | Lee et al. | |
| 7,495,957 B2 | 2/2009 | Futatsuyama | |
| 9,484,104 B2 | 11/2016 | Lee et al. | |
| 10,877,687 B2 | 12/2020 | Rori et al. | |
| 11,056,193 B2 * | 7/2021 | Yun ......................... | G11C 16/08 |
| 11,282,576 B2 * | 3/2022 | Park ....................... | G06F 3/0659 |
| 11,494,123 B2 * | 11/2022 | Kanamori .......... | G11C 16/3459 |
| 2018/0102172 A1 | 4/2018 | Yi | |
| 2018/0122489 A1 | 5/2018 | Ray et al. | |
| 2019/0267106 A1 | 8/2019 | Date et al. | |
| 2020/0091169 A1 | 3/2020 | Tokutomi et al. | |

FOREIGN PATENT DOCUMENTS

JP         2020-47321 A         3/2020

* cited by examiner

*Primary Examiner* — Tha-O H Bui
(74) *Attorney, Agent, or Firm* — Oblon, McClelland, Maier & Neustadt, L.L.P.

(57) ABSTRACT

According to an embodiment, a memory system includes: a nonvolatile memory including a plurality of blocks; and a memory controller. The memory controller is configured to: make a comparison between a first erase voltage application accumulated time period and a first erase verify permission time period each corresponding to a first block targeted for erasure; cause the nonvolatile memory to execute a erase voltage application operation in a case where the first erase voltage application accumulated time period is less than the first erase verify permission time period; and cause the nonvolatile memory to execute a erase verify operation in a case where the first erase voltage application accumulated time period is equal to or greater than the first erase verify permission time period.

17 Claims, 25 Drawing Sheets

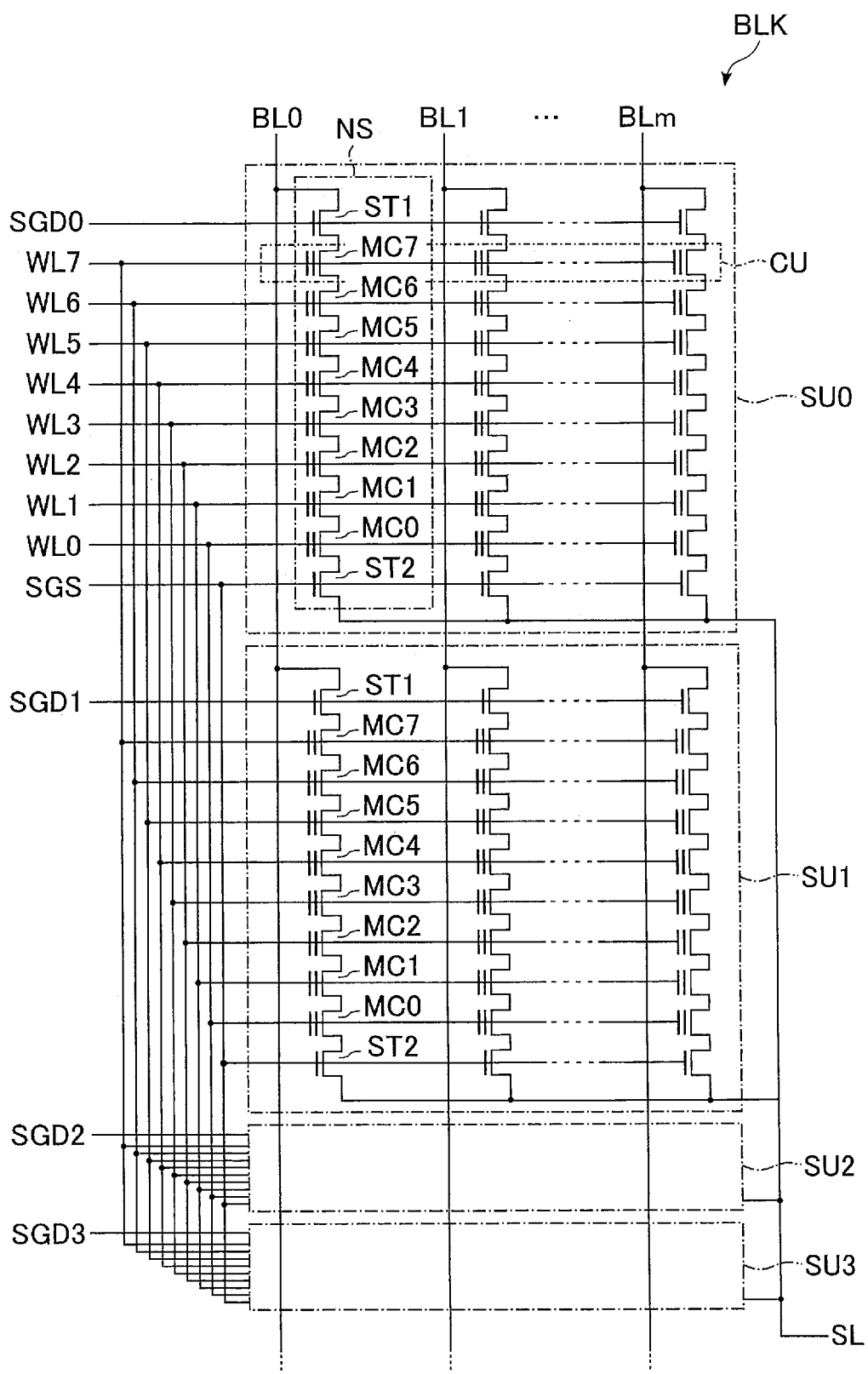
F I G. 3

| Block ID | Erase voltage application accumulated time period | Erase verify permission time period | Erase voltage application target time period | Erase verify status |
|---|---|---|---|---|
| 0 | 0 | TB | TA | Unexecuted |
| 1 | TA | TB | TA | SU1 |

F I G. 4

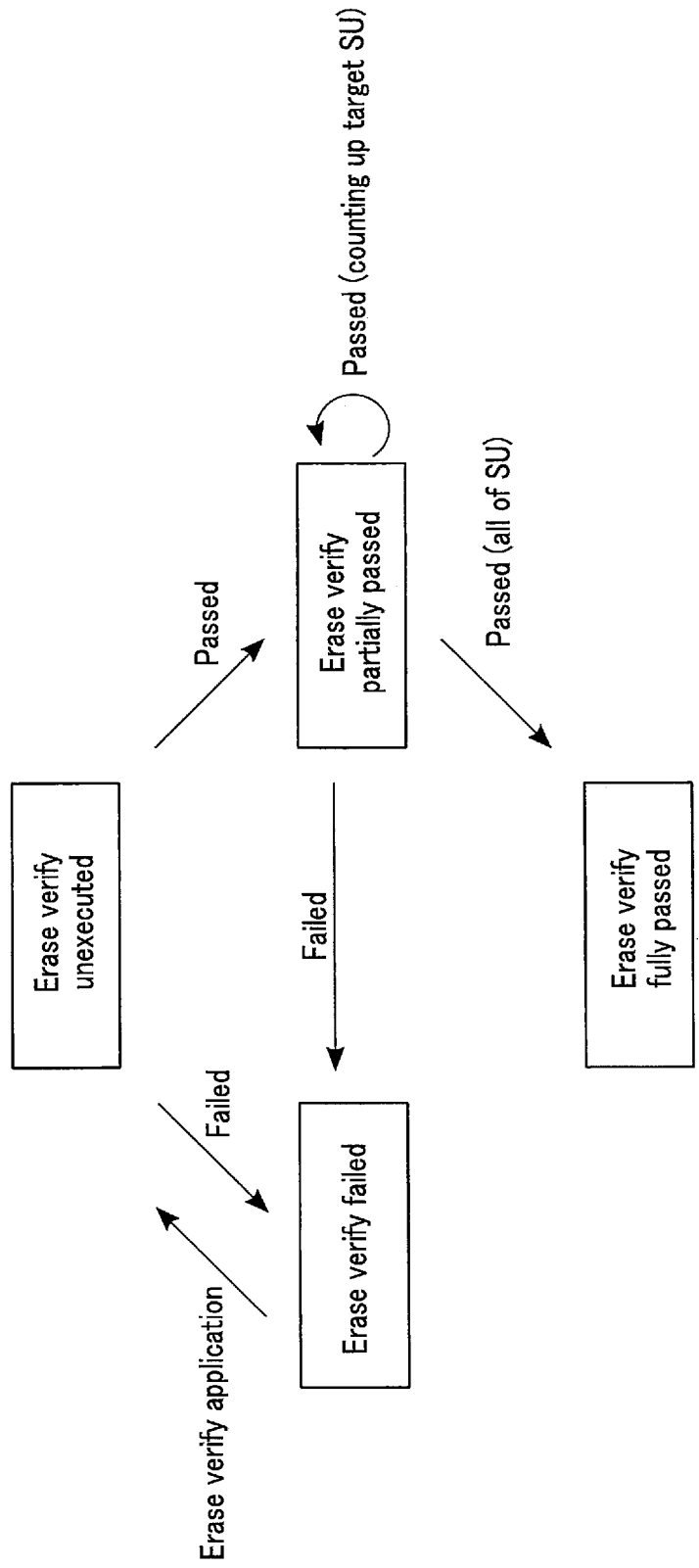
F I G. 10

| Block ID | Erase voltage application accumulated time period | Erase verify permission time period | Erase voltage application target time period | Erase verify status |
|---|---|---|---|---|
| 0 | 0 | TB | TA | Unexecuted | ← PLN0, BLK0
| 1 | 0 | TB | TA | Unexecuted | ← PLN0, BLK1

F I G. 15

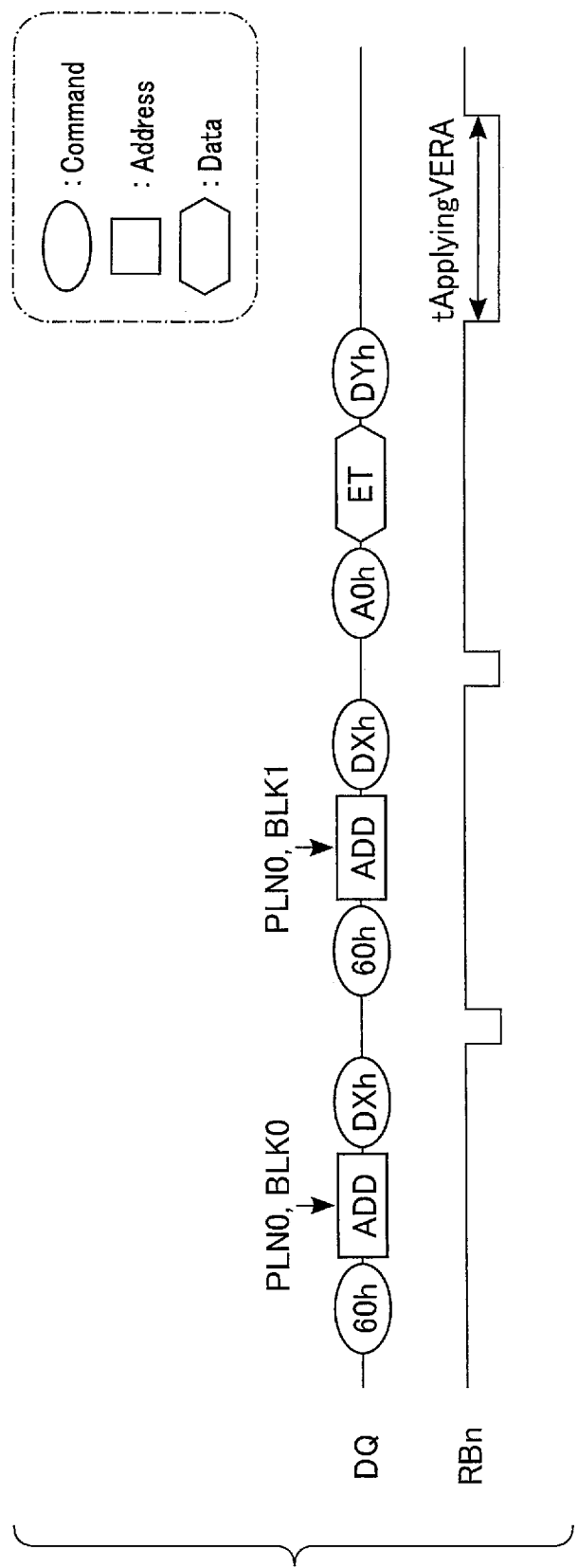
F I G. 17

| Block ID | Erase voltage application accumulated time period | Erase verify permission time period | Erase voltage application target time period | Erase verify status |
|---|---|---|---|---|
| 0 | TC | TB | TA | Unexecuted |
| 1 | 0 | TB | TA | Unexecuted |

F I G. 18

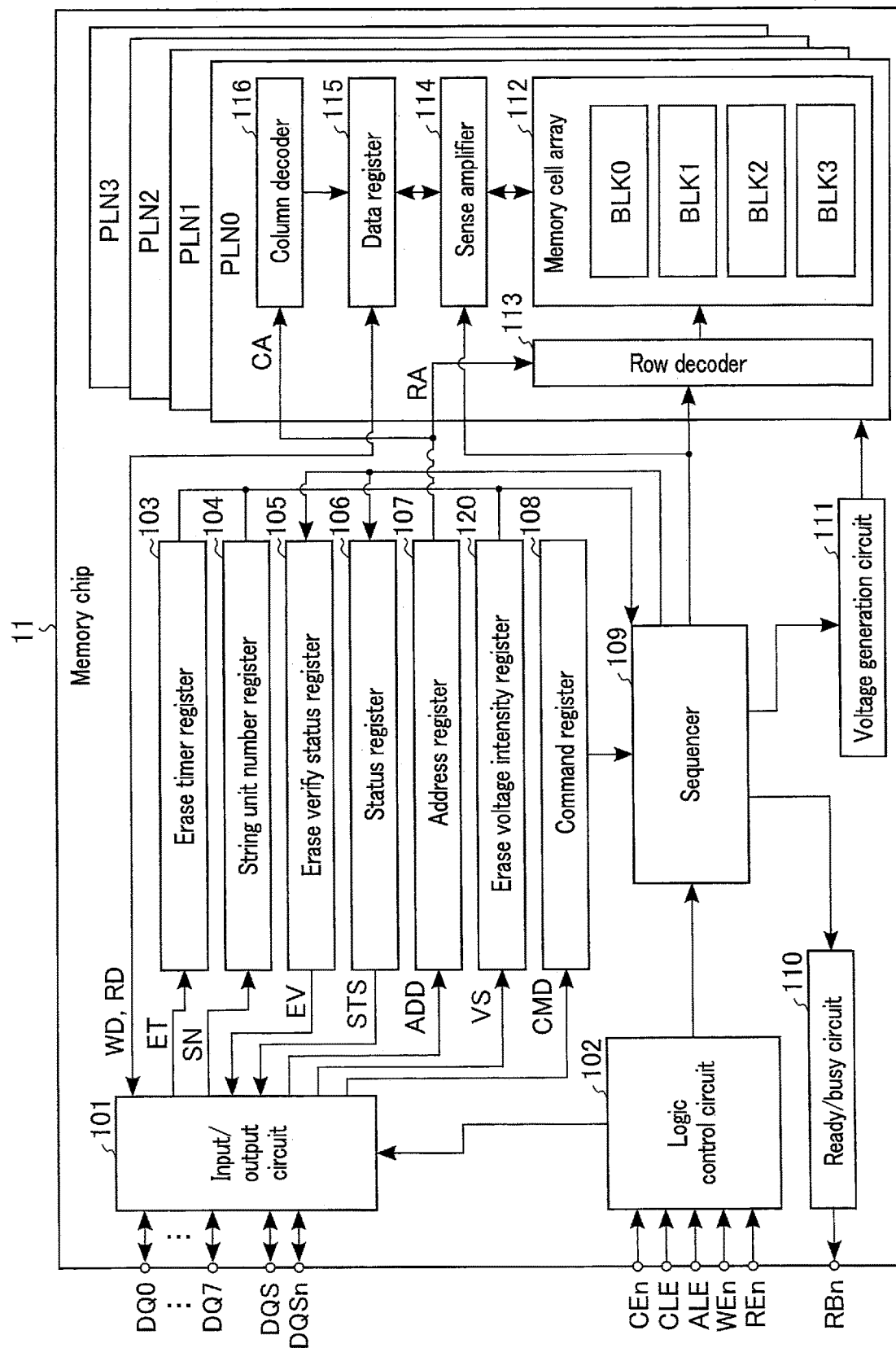
F I G. 20

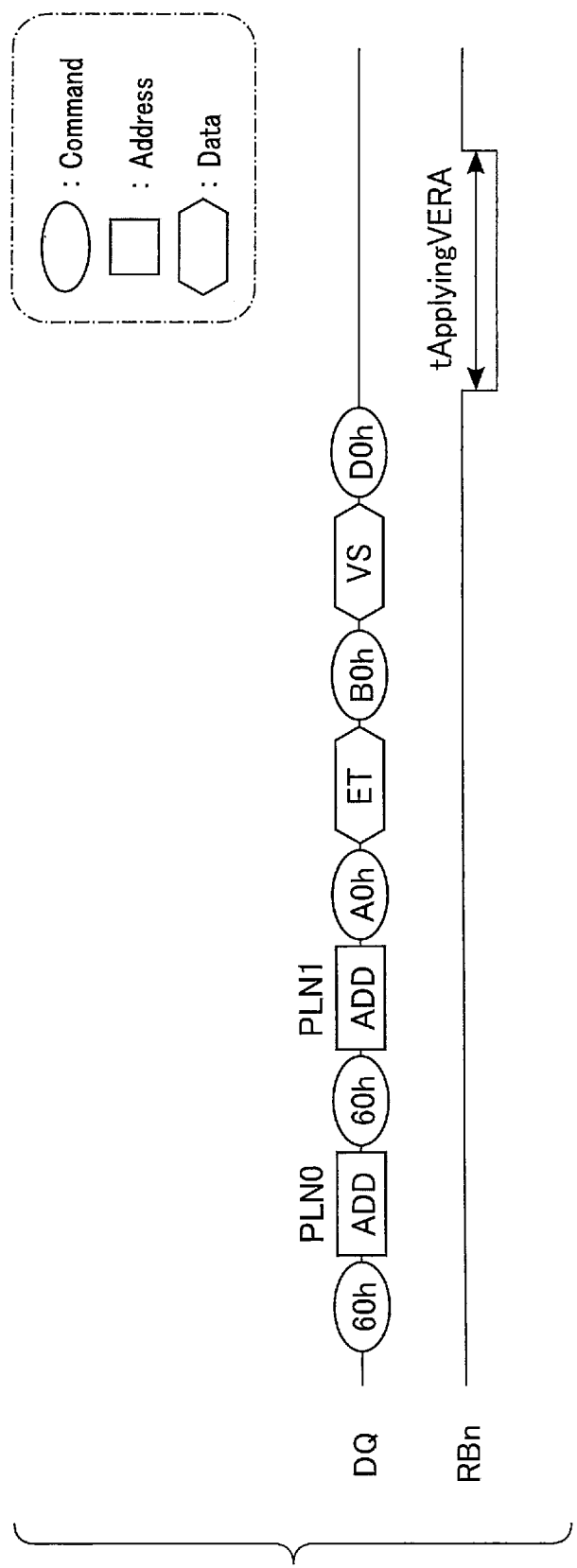
F I G. 23

| Block ID | Erase voltage application accumulated time period | Erase verify permission time period | Erase voltage application target time period | Erase voltage application intensity | Erase verify status |
|---|---|---|---|---|---|
| 0 | TE | TB | TA | 0 | Unexecuted |
| 1 | TE | TB | TA | 0 | Unexecuted |
| 2 | 0 | TD | TC | 1 | Unexecuted |

F I G. 25

MEMORY SYSTEM FOR PERFORMING AN ERASE VOLTAGE APPLICATION OPERATION AND AN ERASE VERIFY OPERATION FOR A NONVOLATILE MEMORY

CROSS-REFERENCE TO RELATED APPLICATIONS

This application is based upon and claims the benefit of priority from Japanese Patent Application No. 2022-092347, filed Jun. 7, 2022, the entire contents of which are incorporated herein by reference.

FIELD

Embodiments described herein relate generally to a memory system.

BACKGROUND

A memory system equipped with a nonvolatile memory such as a NAND flash memory is known.

BRIEF DESCRIPTION OF THE DRAWINGS

FIG. 3 is a circuit diagram of a memory cell array included in the memory chip according to the first embodiment.

FIG. 4 shows an example of an erase target block information table included in the memory system according to the first embodiment.

FIG. 10 is a status transition diagram showing each status of the erase verify operation in the memory system according to the first embodiment.

FIG. 15 shows an example of an erase target block information table included in a memory system according to a second embodiment.

FIG. 17 shows a command sequence of an erase voltage application operation in a case where it is performed on blocks BLK0 and BLK1 of a plane PLN0 simultaneously in the memory system according to the second embodiment.

FIG. 18 shows an example of an erase target block information table included in a memory system according to a third embodiment.

FIG. 20 is a block diagram of a memory chip according to the fourth embodiment.

FIG. 23 shows a command sequence of an erase voltage application operation in a case where it is performed on a selected block BLK of a plane PLN0 and on a selected block BLK of a plane PLN1 simultaneously in the memory system according to the fourth embodiment.

FIG. 25 shows an example of an erase target block information table in a memory system according to a fifth embodiment.

DETAILED DESCRIPTION

In general, according to one embodiment, a memory system includes: a nonvolatile memory including a plurality of blocks each including a plurality of memory cells and being a unit of erasure; and a memory controller configured to cause the nonvolatile memory to execute an erase voltage application operation and an erase verify operation to erase data in at least one of the blocks. The memory controller is configured to: select a first block targeted for erasure from the plurality of blocks; make a comparison between a first erase voltage application accumulated time period and a first erase verify permission time period each corresponding to the first block; cause the nonvolatile memory to execute the erase voltage application operation in a case where the first erase voltage application accumulated time period is less than the first erase verify permission time period; and cause the nonvolatile memory to execute the erase verify operation in a case where the first erase voltage application accumulated time period is equal to or greater than the first erase verify permission time period.

Hereinafter, embodiments will be described with reference to the accompanying drawings. Each embodiment illustrates an apparatus and a method for embodying the technical idea of the invention. The drawings are either schematic or conceptual, and the dimensions, ratios, etc. of each drawing are not necessarily the same as the actual ones. The entire description of an embodiment is applicable to another embodiment, unless otherwise expressly or implicitly excluded. The technical idea of the present invention is not specified by the shapes, structures, arrangements, etc. of the components.

In the following description, structural elements having substantially the same function and configuration will be assigned the same reference symbol. A numeral that follows letters constituting a reference symbol is used to distinguish between elements referred to by reference symbols including the same letters and having a similar configuration. If elements represented by reference symbols including the same letters need not be distinguished from each other, such elements are referred to by reference symbols including the same letters.

Figure 1:
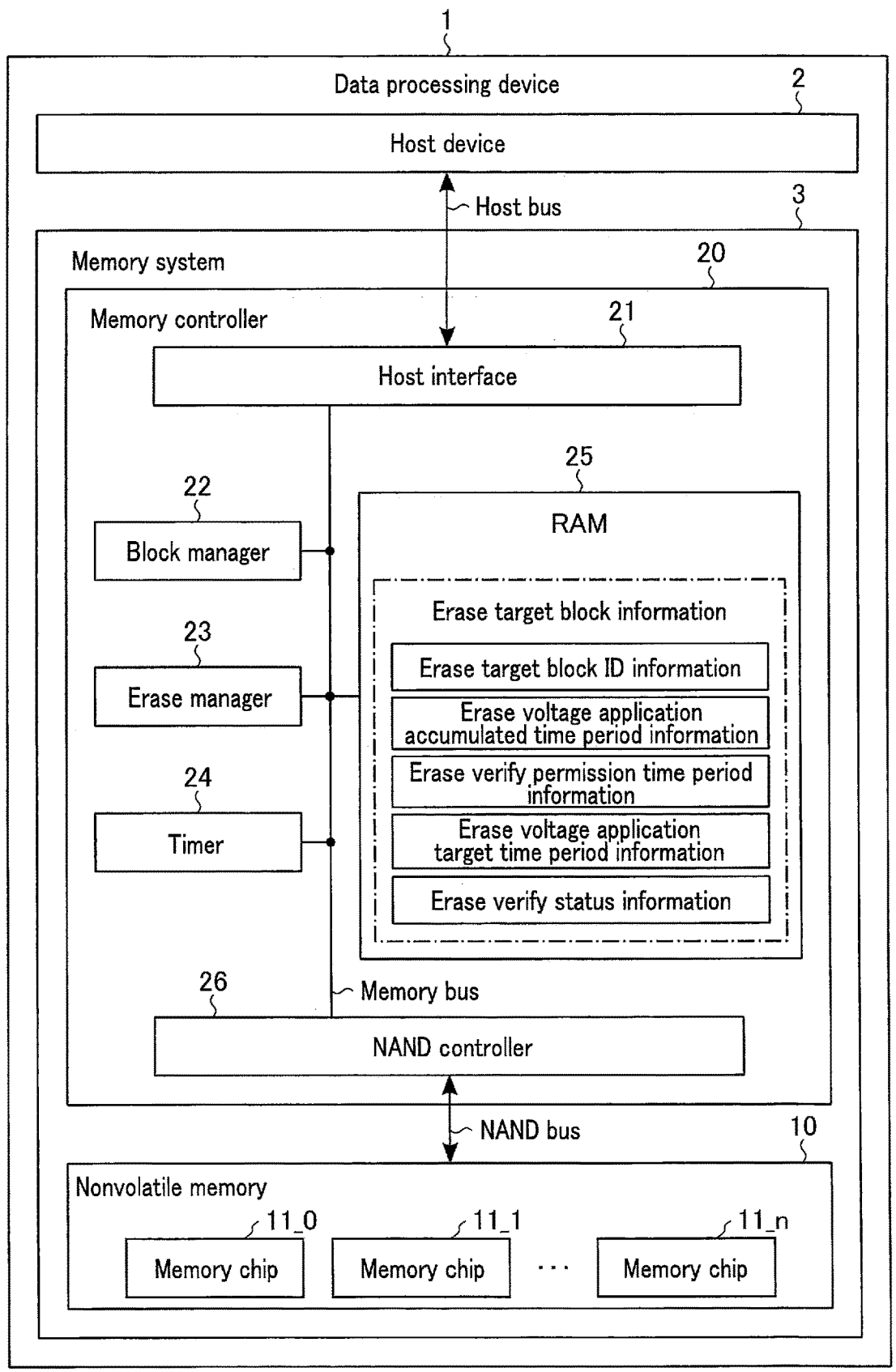
FIG. 1 is a block diagram showing an overall configuration of a data processing device including a memory system according to a first embodiment.

1. First Embodiment 1.1 Configuration 1.1.1. Configuration of Data Processing Device First, an example of the configuration of a data processing device 1 will be described with reference to FIG. 1. FIG. 1 is a block diagram showing an overall configuration of the data processing device 1. In the example shown in FIG. 1, some of the couplings between the constituent elements are indicated by arrows; however, the coupling between the constituent elements are not limited to those shown in FIG. 1.

As shown in FIG. 1, the data processing device 1 includes a host device 2 and a memory system 3. A plurality of memory systems 3 may be coupled to the host device 2.

The host device 2 is an information processing device (computing device) configured to access the memory system 3. The host device 2 controls the memory system 3. More specifically, for example, the host device 2 requests (orders) the memory system 3 to perform a data write operation or a data read operation.

The memory system 3 is, for example, a solid-state drive (SSD). The memory system 3 is coupled to the host device 2 via a host bus. The memory system 3 may be coupled to the host device 2 via a network or by wireless communication.

1.1.2 Configuration of Memory System

An example of the configuration of the memory systems 3 will be described with continuous reference to FIG. 1.

As shown in FIG. 1, the memory system 3 includes a nonvolatile memory 10 and a memory controller 20.

The nonvolatile memory 10 is a nonvolatile storage medium (semiconductor memory device). The nonvolatile memory 10 nonvolatilely stores data received from the memory controller 20. Hereinafter, the case in which the nonvolatile memory 10 is a NAND flash memory will be described. The nonvolatile memory 10 may be a nonvolatile storage medium other than a NAND flash memory.

The nonvolatile memory 10 includes a plurality of memory chips 11 (or simply referred to as "chips"). Each of the memory chips 11 is independently operable. In the example shown in FIG. 1, the nonvolatile memory 10 includes n+1 memory chips 11_0 to 11_$n$ (where n is an integer equal to or greater than 1). The number of memory chips 11 included in the nonvolatile memory 10 is freely selected.

The memory controller 20 is, for example, a system-on-a-chip (SoC). The memory controller 20 manages a memory region of the nonvolatile memory 10. In addition, the memory controller 20 orders the nonvolatile memory 10 to perform a read operation, a write operation, and an erase operation based on a request (order) from the host device 2.

The erase operation roughly includes an erase voltage application operation and an erase verify operation. The erase voltage application operation is an operation of decreasing threshold voltages of memory cell transistors by applying an erase voltage to the memory cell transistors targeted for erasure. The erase verify operation is an operation of determining whether or not the threshold voltages of the memory cell transistors have become smaller than a target voltage. Hereinafter, the case in which the threshold voltages of the memory cell transistors are smaller than a target voltage will be described as the memory cell transistors "having passed the erase verify". On the other hand, the case in which the threshold voltages of the memory cell transistors are equal to or greater than the target voltage will be described as the memory cell transistors "having failed the erase verify". The erase voltage application operation is executed in units of blocks. A block is a unit of a memory region that is selected during the erase voltage application operation. The erase verify operation is executed in units of string units. A string unit is a unit of a memory region that is selected during the write operation or the read operation. A memory region of the memory chip 11 includes a plurality of blocks. Each of the blocks includes a plurality of string units. Each of the string units includes a plurality of memory cell transistors. Configurations of the blocks, string units, and memory cell transistors will be described later.

The memory controller 20 according to a present embodiment may give orders for the erase voltage application operation and the erase verify operation separately to the memory chip 11. For example, another operation such as the write operation or read operation may be executed between the erase voltage application operation and the erase verify operation. A memory region selected during the erase voltage application operation may be different from a memory region selected during the erase verify operation. For example, a block selected during the erase voltage application operation may be different from a block (string units) selected during the erase verify operation. Furthermore, the memory controller 20 may order the memory chip 11 to perform the erase verify operation in units of string units. For example, the plurality of string units included in a single block may be divided and the erase verify operation may be executed multiple times.

Next, an example of an internal configuration of the memory controller 20 will be described. The memory controller 20 includes a host interface circuit 21, a block manager 22, an erase manager 23, a timer 24, a random access memory (RAN) 25, and a NAND controller 26. These circuits are coupled to each other via a memory bus, for example. Each function of the block manager 22 and the erase manager 23 may be implemented by a dedicated circuit or may be implemented by a processor (not shown) executing firmware (or a program).

The host interface circuit 21 is a hardware interface circuit coupled to the host device 2. The host interface circuit 21 performs communications in compliance with an interface standard between the host device 2 and the memory controller 20.

The block manager 22 manages a memory region of the nonvolatile memory 10 in units of blocks. For example, the block manager 22 manages the number of free blocks. A free block is a block in which data has been erased. The free block is available for the write operation. In response to the number of free blocks decreasing to a predetermined threshold or smaller, the block manager 22 selects an erasable block not including valid data. The block manager 22 may select two or more erasable blocks. For example, in response to the number of erasable blocks becoming smaller than a predetermined number, the block manager 22 executes garbage collection. The garbage collection is processing for securing an erasable block. In the garbage collection, for example, valid data in a plurality of blocks is copied to another block. This brings a block serving as a copy source to an erasable state in which the block contains no valid data.

The block manager 22 transmits information on a selected erase target block to the erase manager 23. The information transmitted to the erase manager 23 includes erase target block ID information, erase voltage application target time period information, and erase verify permission time period information.

The erase target block ID information is ID information on an erase target block. For example, each block in the nonvolatile memory 10 is assigned a different ID number.

The erase voltage application target time period information is information on an erase voltage application target time period during the erase voltage application operation. For example, the erase voltage application target time period is set based on the degree of exhaustion (the number of times the write operation and the erase operation are repeated) of a memory cell transistor. For example, as the degree of exhaustion of a memory cell transistor increases, the erase voltage application target time period is set to longer.

The erase verify permission time period information is information on an erase voltage application accumulated time period based on which whether to permit execution of the erase verify operation is determined. For example, the erase verify permission time period is set based on the degree of exhaustion of a memory cell transistor. For example, in response to the erase voltage application accumulated time period in an erase target block reaching the erase verify permission time period or greater, execution of the erase verify operation in this block is permitted. For example, even in the case where the erase voltage application operation is suspended, if the erase voltage application accumulated time period in an erase target block is equal to or greater than the erase verify permission time period, execution of the erase verify operation in this block is permitted.

The erase manager 23 manages the erase operation in the erase target block. Upon receipt of the erase target block ID information, the erase verify permission time period information, and the erase voltage application target time period information from the block manager 22, the erase manager 23 prepares an entry of the erase target block information corresponding to the erase target block. The erase target block information includes the erase target block ID information, erase voltage application accumulated time period information, the erase verify permission time period information, the erase voltage application target time period information, and erase verify status information.

The erase voltage application accumulated time period information is information on a cumulative total of a time period during which the erase voltage is applied to the erase target block through the erase voltage application operation. Upon termination of the erase voltage application operation, the erase voltage application accumulated time period is updated by the erase manager 23. The erase manager 23 sets an erase voltage application set time period at the time of execution of the erase voltage application operation based on a difference between the erase voltage application target time period and the erase voltage application accumulated time period.

The erase verify status information is status information on the erase verify operation. The erase verify status information is updated by the erase manager 23 upon termination of the erase verify operation. For example, the erase verify status information includes information on whether the erase verify operation has been executed or not, information on a pass/failure of the erase verify (hereinafter, also referred to as "erase verify pass information"), and information on a string unit which has passed the erase verify operation.

The erase manager 23 causes the memory chip 11 to execute either the erase voltage application operation or the erase verify operation, based on the erase target block information. Upon termination of the erase voltage application operation or the erase verify operation, the erase manager 23 updates the erase target block information.

More specifically, the erase manager 23 compares the erase voltage application accumulated time period with the erase verify permission time period. The erase manager 23 selects a block exhibiting an erase voltage application accumulated time period that is less than the erase verify permission time period, and causes the selected block to execute the erase voltage application operation. Hereinafter, a block selected by the erase manager 23 will also be referred to as a "selected block". At this time, the erase manager 23 sets a difference between the erase voltage application target time period and the erase voltage application accumulated time period to the erase voltage application set time period in the erase voltage application operation. Upon termination of the erase voltage application operation, the erase manager 23 estimates the erase voltage application time period based on a timer value received from the timer 24. The erase manager 23 adds the estimated erase voltage application time period to the erase voltage application accumulated time period. The erase voltage application accumulated time period may not reach the erase verify permission time period in the case where, for example, the erase voltage application operation is suspended. In such a case, the erase manager 23 causes the selected block to execute the erase voltage application operation again.

Furthermore, the erase manager 23 selects a block exhibiting the erase voltage application accumulated time period to be equal to or greater than the erase verify permission time period, and causes the selected block to execute the erase verify operation. At this time, the erase manager 23 may select one or more string units within the selected block. Upon termination of the erase verify operation, the erase manager 23 reads erase verify pass information from the memory chip 11 which has been caused to execute the erase verify operation. The erase verify pass information read from the memory chip 11 includes information on pass/failure of the erase verify. In the case where a string unit has passed the erase verify, the erase manager 23 stores information on this string unit as the erase verify status information of the erase target block information. In the case where all of the string units within the selected block have passed the erase verify, the erase manager 23 deletes the information on this block from the erase target block information. Furthermore, in the case where a string unit has failed the erase verify, the erase manager 23 updates the erase voltage application accumulated time period information and the erase verify status information, and causes the corresponding block to execute the erase voltage application operation again.

The timer 24 measures a length of a time period under control of the NAND controller 26. The timer 24 transmits information on the measured time period (referred to as a "timer value") to the erase manager 23. More specifically, for example, the timer 24 measures a time period during which a ready/busy signal of the memory chip 11 that is executing the erase voltage application operation exhibits a busy state. The ready/busy signal is a signal indicating whether the memory chip 11 is in a state in which it can receive a command from the memory controller 20 (referred to as a "ready state") or in a state in which it cannot receive such a command (referred to as a "busy state"). For example, the ready/busy signal is set to a high ("H") level while the memory chip 11 is in the ready state, and is set to a low ("L") level while the memory chip 11 is in the busy state. The timer 24 measures a time period during which the ready/busy signal is at the "L" level.

The RAM 25 is a volatile memory. The RAM 25 is a dynamic random access memory (DRAM) or a static random access memory (SRAM). The RAM 25 stores the erase target block information.

The NAND controller 26 controls the memory chip 11. In addition, the NAND controller 26 controls the timer 24. The NAND controller 26 is coupled to each memory chip 11 via the NAND bus. FIG. 1 shows the example in which n+1 memory chips 11 are coupled to the single NAND controller 26. A plurality of NAND controllers 26 may be provided. In such a case, the NAND controllers 26 are coupled to the various memory chips 11 via various NAND buses, respectively.

For example, the NAND controller 26 causes the memory chip 11 including the selected block (hereinafter, also referred to as a "selected memory chip") to execute the erase voltage application operation or the erase verify operation, based on an order from the erase manager 23. In other words, based on an order from the erase manager 23, the NAND controller 26 issues a command for the erase voltage application operation or the erase verify operation and transmits it to the selected memory chip 11. For example, in the case of causing the selected memory chip 11 to execute the erase voltage application operation, the NAND controller 26 initializes the timer 24 in advance. The NAND controller 26 causes the timer 24 to measure a time period during which the ready/busy signal is at the "L" level while the erase voltage application operation is executed.

1.1.3 Configuration of Memory Chip

Figure 2:
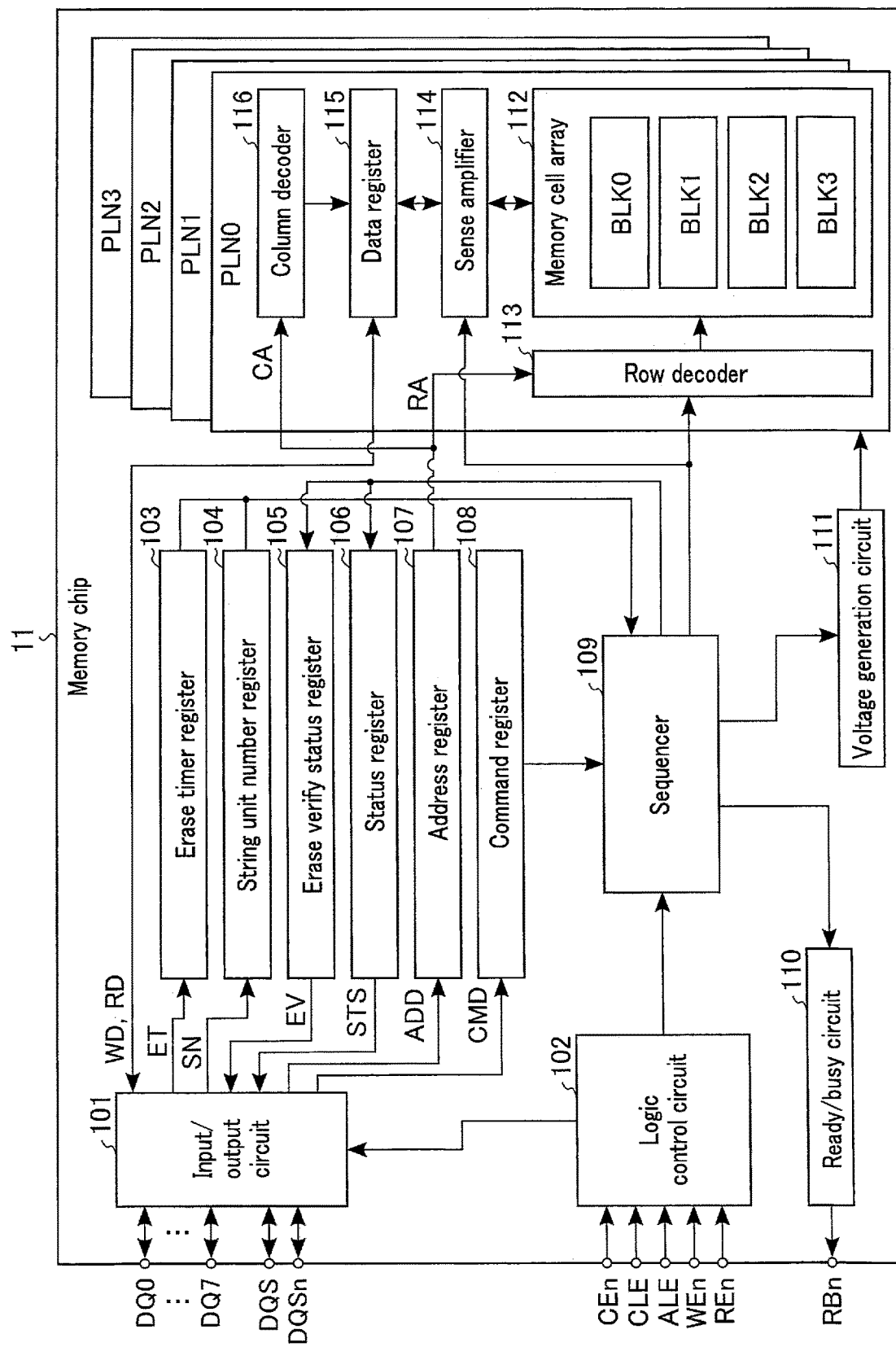
FIG. 2 is a block diagram of a memory chip according to the first embodiment.

Next, an example of the configuration of the memory chips 11 will be described with reference to FIG. 2. FIG. 2 is a block diagram of the memory chip 11. In the example of FIG. 2, some of the couplings between the constituent elements are indicated by arrows. However, the coupling between the constituent elements are not limited to those shown in FIG. 2.

As shown in FIG. 2, the memory chip 11 includes an input/output circuit 101, a logic controller 102, an erase timer register 103, a string unit number register 104, an erase verify status register 105, a status register 106, an address register 107, a command register 108, a sequencer 109, a ready/busy circuit 110, a voltage generator 111, and a plurality of planes PLN.

The input/output circuit 101 is a circuit configured to input and output a signal DQ. The input/output circuit 101 is coupled to the NAND controller 26. The input/output circuit 101 is coupled to the logic controller 102, the erase timer register 103, the string unit number register 104, the erase verify status register 105, the status register 106, the address register 107, the command register 108, and a data register 115 of each plane PLN.

The input/output circuit 101 transmits and receives, for example, an eight-bit signal DQ (signals DQ0 to DQ7) and timing signals DQS and DQSn, to and from the NAND controller 26 (memory controller 20). Examples of the signal DQ include various types of input/output data, an address ADD, and a command CMD. Examples of input data include write data WD, erase voltage application set time period data ET, and string unit number data SN. Examples of output data include read data RD, erase verify pass information EV, and status information STS.

The write data WD is data written in a memory cell array 112.

The erase voltage application set time period data ET is data of an erase voltage application set time period during the erase voltage application operation.

The string unit number data SN is data on the number of string units that execute the erase verify operation.

The read data RD is data read from the memory cell array 112.

The erase verify pass information EV is information on a pass/failure of the erase verify.

The status information STS is status information in the write operation, the read operation, and the erase operation.

The timing signals DQS and DQSn are timing signals that are used at the time of input or output of data. The timing signal DQSn is an inversion signal of the signal DQS.

In the case where the input signal DQ is the data DAT, the input/output circuit 101 receives the signal DQ based on the clock signals DQS and DQSn.

In the case where the input signal DQ is the write data WD, the input/output circuit 101 transmits the write data WD to the data register 115 of the corresponding plane PLN. In the case where the input signal DQ is the erase voltage application set time period data ET, the input/output circuit 101 transmits the erase voltage application set time period data ET to the erase timer register 103. In the case where the input signal DQ is the string unit number data SN, the input/output circuit 101 transmits the string unit number data SN to the string unit number register 104. In the case where the input signal DQ is the address ADD, the input/output circuit 101 transmits the address ADD to the address register 107. In the case where the input signal DQ is the command CMD, the input/output circuit 101 transmits the command CMD to the command register 108.

In the case where the output signal DQ is data, the input/output circuit 101 transmits the signal DQ along with the timing signals DQS and DQSn to the NAND controller 26.

In the case where the output signal DQ is the read data RD, the input/output circuit 101 receives the read data RD from the data register 115. In the case where the output signal DQ is the erase verify pass information EV, the input/output circuit 101 receives the erase verify pass information EV from the erase verify status register 105. In the case where the output signal DQ is the status information STS, the input/output circuit 101 receives the status information STS from the status register 106.

The logic controller 102 is a circuit configured to perform logic control of the memory chip 11. The logic controller 102 is coupled to the NAND controller 26. The logic controller 102 is further coupled to the input/output circuit 101 and the sequencer 109. The logic controller 102 receives various control signals from the NAND controller 26. For example, the control signal includes a chip enable signal CEn, a command latch enable signal CLE, an address latch enable signal ALE, a write enable signal WEn, and a read enable signal REn.

The chip enable signal CEn is a signal for enabling the memory chip 11. The signal CEn is asserted at, for example, the "L" level.

The command latch enable signal CLE is a signal indicating that the signal DQ is a command. The signal CLE is asserted at, for example, the "H" level.

The address latch enable signal ALE is a signal indicating that the signal DQ is an address. The signal ALE is asserted at, for example, the "H" level.

The write enable signal WEn is a signal for fetching the signal DQ in the case where the signal DQ is the command CMD or the address ADD. The signal WEn is asserted at, for example, the "L" level at a timing when the memory chip 11 fetches the command CMD or the address ADD. Therefore, every time the signal WEn is toggled, the command CMD or the address ADD is fetched into the memory chip 11.

The read enable signals REn are signals for the memory controller 20 to read data from the memory chip 11. The signal REn is asserted at, for example, the "L" level. For example, the memory chip 11 generates the signals DQS and DQSn based on the signal REn at the time of output of data.

The logic controller 102 controls the input/output circuit 101 and the sequencer 109 based on the received control signal.

The erase timer register 103 is a register that temporarily stores the erase voltage application set time period data ET. The erase timer register 103 is coupled to the input/output circuit 101 and the sequencer 109. The erase timer register 103 transmits the erase voltage application set time period data ET to the sequencer 109.

The string unit number register 104 is a register configured to temporarily store the string unit number data SN. The string unit number register 104 is coupled to the input/output circuit 101 and the sequencer 109. The string unit number register 104 transmits the string unit number data SN to the sequencer 109.

The erase verify status register 105 is a register configured to temporarily store the erase verify pass information EV. The erase verify status register 105 is coupled to the input/output circuit 101 and the sequencer 109. The erase verify status register 105 receives the erase verify pass information EV from the sequencer 109.

The status register 106 is a register configured to temporarily store the status information STS. The status register 106 is coupled to the input/output circuit 101 and the sequencer 109. The status register 106 receives the status information STS from the sequencer 109.

The address register 107 is a register configured to temporarily store the address ADD. The address register 107 is coupled to the input/output circuit 101, the row decoder 113 of each plane PLN, and the column decoder 116 of each plane PLN. The address ADD includes a row address RA and a column address CA. The address register 107 transmits the row address RA to a row decoder 113 of the corresponding plane PLN. The address register 107 transmits the column address CA to a column decoder 116 of the corresponding plane PLN.

The command register 108 is a register coupled to temporarily store the command CMD. The command register 108 is coupled to the input/output circuit 101 and the sequencer 109. The command register 108 transmits the command CMD to the sequencer 109.

The sequencer 109 is a circuit configured to control the memory chip 11. The sequencer 109 controls an operation of the entire memory chip 11. For example, the sequencer 109 is coupled to the erase timer register 103, the string unit number register 104, the erase verify status register 105, the status register 106, the command register 108, the ready/busy circuit 110, the voltage generator 111, the row decoder 113 of each plane PLN, and the sense amplifier 114 of each plane PLN. For example, the sequencer 109 controls the erase verify status register 105, the status register 106, the ready/busy circuit 110, the voltage generator 111, the row decoder 113 of each plane PLN, and the sense amplifier 114 of each plane PLN. The sequencer 109 executes the write operation, the read operation, the erase voltage application operation, the erase verify operation, etc., based on the command CMD.

For example, upon receipt of a command for the erase voltage application operation from the command register 108, the sequencer 109 reads the erase voltage application set time period data ET from the erase timer register 103. The sequencer 109 then sets the erase voltage application set time period based on the erase voltage application set time period data ET. Thereafter, the sequencer 109 performs the erase voltage application operation.

Furthermore, for example, upon receipt of a command for the erase verify operation from the command register 108, the sequencer 109 reads the string unit number data SN from the string unit number register 104. The sequencer 109 repeatedly executes the erase verify operation based on the string unit number data SN. The sequencer 109 updates the erase verify pass information EV and transmits the updated information EV to the erase verify status register 105 every time the erase verify operation is terminated.

The ready/busy circuit 110 is a circuit configured to transmit a ready/busy signal RBn. The ready/busy controller 110 transmits the ready/busy signal RBn to the memory controller 20 based on an operation status of the sequencer 109.

The voltage generator 111 generates voltages to be used for the write operation, the read operation, and the erase operation. The voltage generator 111 is coupled to the row decoder 113, the sense amplifier 114, etc., of each plane PLN. For example, the voltage generator 111 supplies a generated voltages to the row decoder 113 and the sense amplifier 114.

Each of the planes PLN is a unit configured to perform the write operation, the read operation, and the erase operation. FIG. 2 shows the example in which the memory chip 11 includes four planes PLN0, PLN1, PLN2, and PLN3. The number of planes PLN is not limited to four. The number of planes PLN may be one or more other than four. Planes PLN0 to PLN3 are independently operable to perform the write operation, the read operation, or the erase operation. Furthermore, the planes PLN0 to PLN3 are operable in parallel.

Next, the internal configuration of the plane PLN will be described. Hereinafter, the case in which the planes PLN0 to PLN3 have the same configuration will be described. The planes PLN may respectively have different configurations. Hereinafter, in the case of not specifying one of the planes PLN0 to PLN3, they will be referred to as "plane PLN". The plane PLN includes the memory array 112, the row decoder 113, the sense amplifier 114, the data register 115, and the column recorder 116.

The memory cell array 112 is a set of memory cell transistors aligned in a two-dimensional or three-dimensional matrix pattern (hereinafter, referred to as "memory cells"). The memory cell array 112 includes, for example, four blocks BLK0, BLK1, BLK2, and BLK3. The number of blocks BLK in the memory cell array 112 is freely selected. The block BLK is, for example, a set of memory transistors data of which is erased in batch. That is, the block BLK is a unit of data erasure. The configuration of the block BLK will be described later in detail.

The row decoder 113 is a decode circuit for the row address RA. The row decoder 113 selects one of the blocks BLK in the memory cell array 112 based on a result of decoding. The row decoder 113 applies voltages to interconnects (word lines and select gate lines to be described later) in the row direction of the selected block BLK. The row decoder 113 may be configured to select a plurality of blocks BLK. In such a case, for example, the row decoder 113 may include the plurality of latch circuits corresponding to the respective blocks BLK. For example, each of the latch circuits stores a result of decoding the row address RA.

The sense amplifier 114 is a circuit configured to write and read data. The sense amplifier 114 is coupled to the memory cell array 112. The sense amplifier 114 reads the read data RD from the memory cell array 112 during the read operation. The sense amplifier 114 supplies voltages corresponding to the write data WD to the memory cell array 112 in the write operation.

The data register 115 is a register configured to temporarily store the write data WD or the read data RD. The data register 115 is coupled to the sense amplifier 114. The data register 115 includes a plurality of latch circuits. Each of the latch circuits temporarily stores the write data WD or the read data RD.

The column decoder 116 is a circuit configured to decode the column address CA. The column decoder 116 receives the column address CA from the address register 107. The column decoder 116 selects the latch circuits within data register 115 based on a result of decoding the column address CA.

1.1.4 Circuit Configuration of Memory Cell Array

Next, an example of a circuit configuration of the memory cell array 112 will be described with reference to FIG. 3. FIG. 3 is a circuit diagram of the memory cell array 112. FIG. 3 shows an example of the circuit configuration of the single block BLK.

As shown in FIG. 3, the block BLK includes a plurality of string units SU. Each of the string units SU is, for example, a set of NAND strings NS that are selected in batch during the write operation, the read operation, the erase verify operation, etc. FIG. 3 shows the example in which the block BLK includes four string units SU0 to SU3. The number of string units SU included in the block BLK is freely selected.

Next, the internal configuration of the string unit SU will be described. The string unit SU includes a plurality of NAND strings NS. Each of the NAND strings NS is a set of memory cell transistors coupled in series. For example, m+1 NAND strings NS (where m is an integer equal to or greater than 1) in each string unit SU are respectively coupled to m+1 bit lines BL0 to BLm.

Next, the internal configuration of each NAND string NS will be described. Each NAND string NS includes a plurality of memory cell transistors MC and select transistors ST1 and ST2. FIG. 3 shows the example in which each NAND string NS includes eight memory cell transistors MC0 to MC7. The number of memory cell transistors MC in each NAND string NS is freely selected.

Each of the memory cell transistors MC nonvolatilely stores data. Each of the memory cell transistors MC includes a control gate and a charge storage layer. Each of the memory cell transistors MC may be of a metal-oxide-nitride-oxide-silicon (MONOS) type or may be of a floating gate (FG) type. The MONOS type uses an insulating layer as the charge storage layer. The FG type uses a conductive layer as the charge storage layer.

The select transistors ST1 and ST2 are used to select a string unit SU in various operations. The number of select transistors ST1 and ST2 is freely selected. It suffices that each NAND string NS contains one or more select transistors ST1 and one or more select transistors ST2.

In each NAND string NS, the current paths of the memory cell transistors MC and the select transistors ST1 and ST2 are coupled in series. More specifically, the current paths of select transistor ST2, the memory cell transistors MC0 to MC7, and the select transistor ST1 are coupled in series in this order. A drain of the select transistor ST1 is coupled to one of the bit lines BL. A source of the select transistor ST2 is coupled to a source line SL.

The plurality of memory cell transistors MC0 to MC7 included in the same block BLK have their control gates coupled to word lines WL0 to WL7, respectively. More specifically, for example, the block BLK includes four string units, SU0 to SU3. Each of the string units SU0 to SU3 includes the plurality of memory cell transistors MC0. The plurality of memory cell transistors MC0 included in the same block BLK have their control gates coupled to the single word line WL0. The same applies to the memory cell transistors MC1 to MC7.

The plurality of select transistors ST1 in each string unit SU have their gates coupled in common to the single select gate line SGD. More specifically, the string unit SU0 includes the plurality of select transistors ST1. The plurality of select transistors ST1 in the string unit SU0 have their gates coupled in common to the select gate line SGD0. Similarly, the plurality of select transistors ST1 in the string unit SU1 have their gates coupled in common to the select gate line SGD1. The plurality of select transistors ST1 in the string unit SU2 have their gates coupled in common to the select gate line SGD2. The plurality of select transistors ST1 in the string unit SU3 have their gates coupled in common to the select gate line SGD3.

The plurality of select transistors ST2 in the same block BLK have their gates coupled in common to the single select gate line SGS. More specifically, for example, each block BLK includes four string units, SU0 to SU3. Each of the string units SU0 to SU3 includes the plurality of select transistors ST2. These select transistors ST2 included in each block BLK have their gates coupled in common to the single select gate line SGS. As with the select gate lines SGD, a different select gate line SGS may be provided for each string unit SU.

The word lines WL0 to WL7, the select gate lines SGD0 to SGD3, and the select gate line SGS are each coupled to the row decoder 113.

The bit lines BL are coupled in common to the single NAND string NS in each string unit SU of each block BLK. The plurality of NAND strings NS coupled to the single bit line are assigned the same column address CA. Each of the bit lines BL is coupled to the sense amplifier 114.

The source line SL is shared by, for example, the plurality of blocks BLK.

In the single string unit SU, a set of memory cell transistors MC coupled to the single word line WL will be referred to as a "cell unit CU". For example, in the case where each memory cell transistor MC stores one-bit data, a storage capacity of the cell unit CU will be defined as "one-page data". The cell unit CU may have a storage capacity of two-page data or more in accordance with the number of bits stored in each memory cell transistor MC.

1.2 Erase Target Block Information

Next, an example of erase target block information will be described with reference to FIG. 4. FIG. 4 is an example of an erase target block information table.

As shown in FIG. 4, the erase manager 23 prepares entries for the erase target block information table for each erase target block. FIG. 4 shows the example in which entries for the blocks BLK respectively assigned the block IDs of "0" and "1" are prepared. Hereinafter, the block BLK assigned the block ID of "0" will be referred to as a "block BLK_ID0". The block BLK assigned the block ID of "1" will be referred to as a "block BLK_ID1". The same applies to the other block IDs.

First, the block BLK_ID0 will be described. For example, the erase manager 23 receives from the block manager 22 information on the block ID being equal to "0", the erase voltage application target time period being equal to "TA", and the erase verify permission time period being equal to "TB". Herein, the erase voltage application target time period "TA" and the erase verify permission time period "TB" establish the relationship of "TA"≥"TB". The erase manager 23 prepares an entry corresponding to the block BLK_ID0 based on the aforementioned information. In preparation for entries, the erase voltage application accumulated time period is set to "0", and the erase verify status information is set to "unexecuted". For example, in the case of the block BLK_ID0, the erase voltage application accumulated time period is "0". Therefore, the erase voltage application operation on the block BLK_ID0 is not executed. With the relationship of "0"<"TB", the erase manager 23 orders the NAND controller 26 to perform the erase voltage application operation on the block BLK_ID0.

Next, the block BLK_ID1 will be described. For example, the erase manager 23 receives from the block manager 22 information on the block ID being equal to "1", the erase voltage application target time period being equal to "TA", and the erase verify permission time period being equal to "TB". The erase manager 23 prepares an entry corresponding to the block BLK_ID1 based on the aforementioned information. For example, in the case of the block BLK_ID1, the erase voltage application accumulated time period is "TA". With the relationship of "TA"≥"TB", the erase manager 23 terminates the erase voltage application operation and permits (selects) the erase verify operation. Furthermore, the erase verify status information on the block BLK_ID1 is "SU1". This information indicates that the string units SU0 and SU1 have passed the erase verify. The erase verify operations are respectively executed on, for example, the string units SU0, SU1, SU2, and SU3 in this order in such a manner as to count up the number assigned to the string unit SU. Thus, information on the string unit SU which has passed the erase verify the most recently is stored as the erase verify status information. For example, the erase manager 23 orders the NAND controller 26 to perform the erase verify operation on the string unit SU2. At this time, the erase manager 23 may select one or more string units SU as a target for the erase verify operation. For example, in the case of the block BLK_ID1, the string units SU2 and SU3 may be selected.

Figure 5:
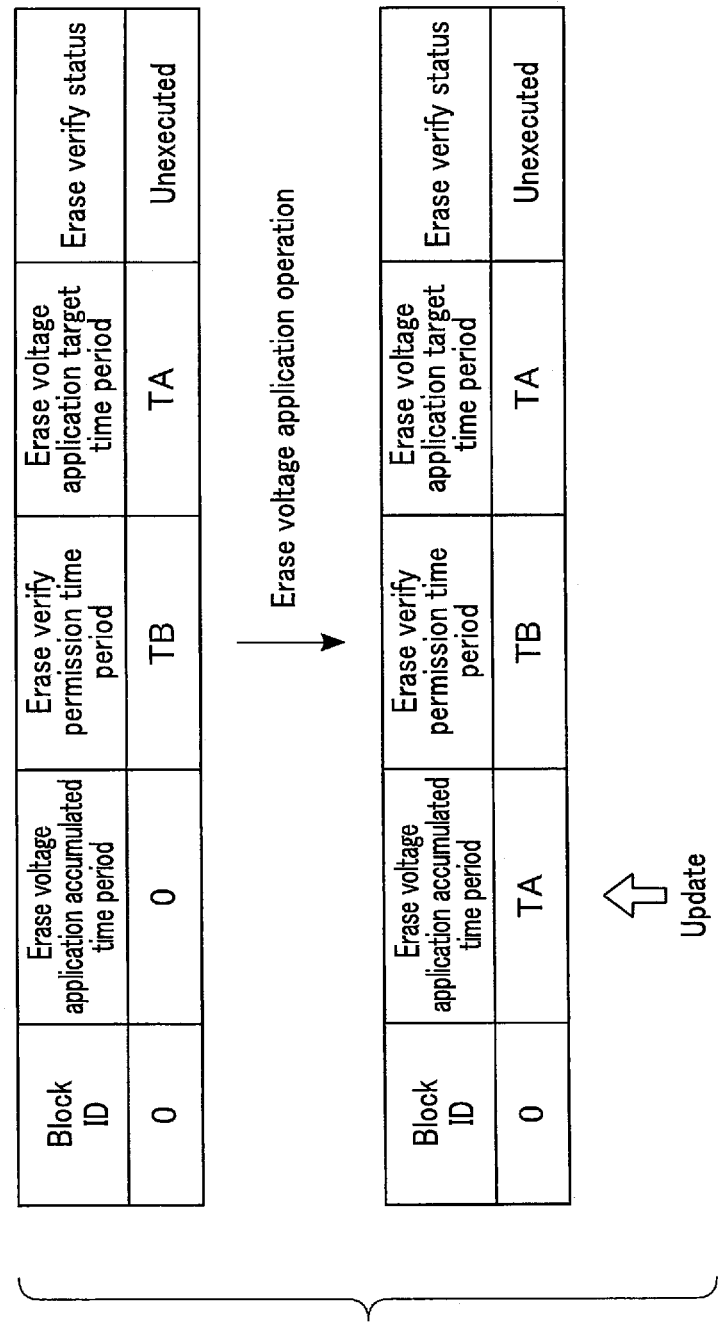
FIG. 5 is a diagram showing an example of updating erase target block information after an erase voltage application operation in the memory system according to the first embodiment.

Next, updating of the erase target block information after the erase voltage application operation will be described with reference to FIG. 5. FIG. 5 is a diagram showing an example of updating the erase target block information after the erase voltage application operation. The example shown in FIG. 5 omits information on the block BLK_ID1 in order to simplify the description.

As shown in FIG. 5, the erase manager 23 orders the NAND controller 26 to perform the erase voltage application operation on the block BLK_ID0, based on the erase target block information. After the erase voltage application operation, the erase manager 23 updates the erase voltage application accumulated time period information. FIG. 5 shows the example in which the updated erase voltage application accumulated time period is "TA". With the relationship of "TA"≥"TB", the erase manager 23 terminates the erase voltage application operation and permits the erase verify operation. With reference to the erase verify status information, the erase verify operation is "unexecuted". In this case, the erase manager 23 orders the NAND controller 26 to perform the erase verify operation in order from the string unit SU0 of the corresponding block BLK.

Figure 6:
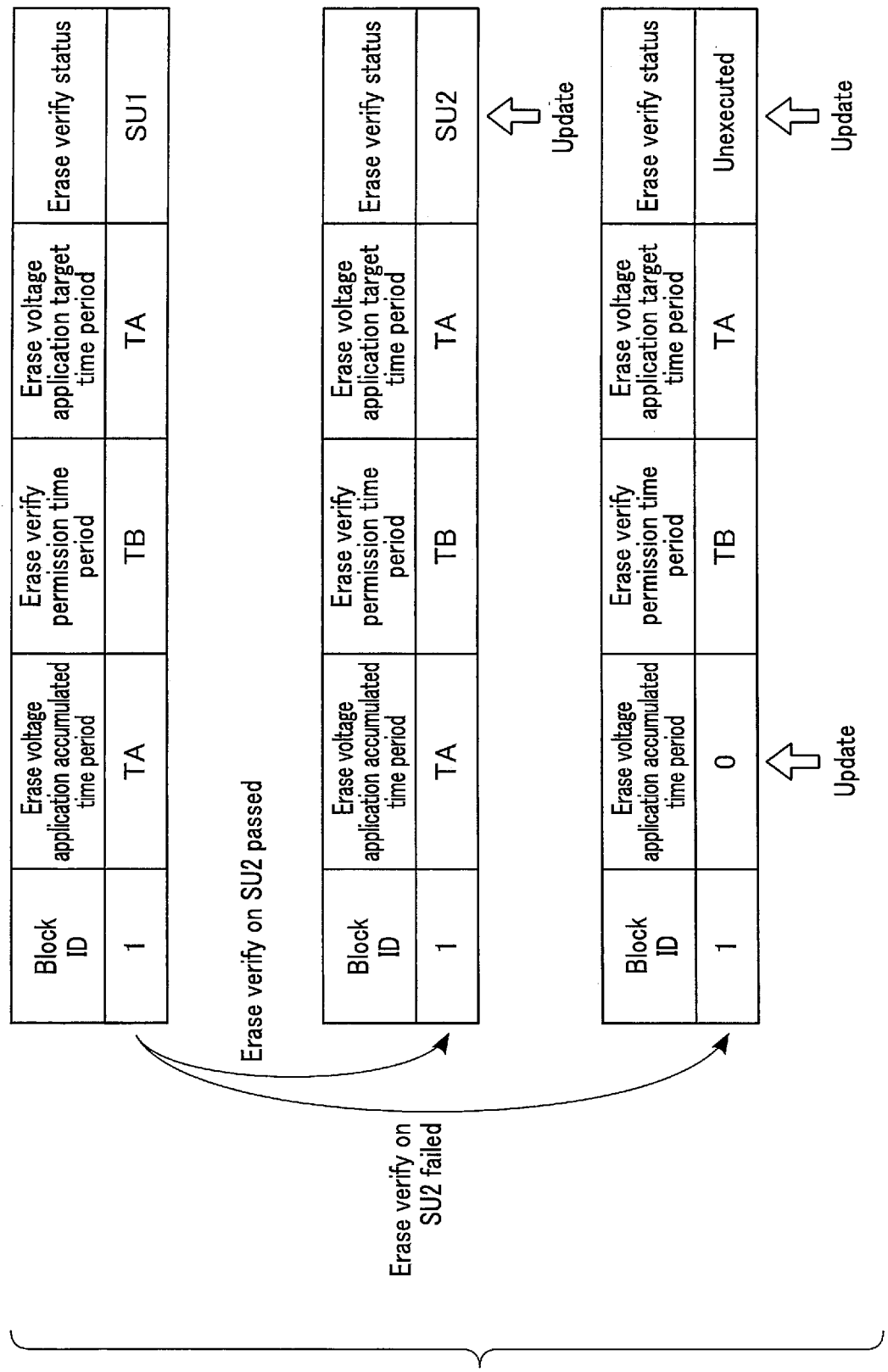
FIG. 6 is a diagram showing an example of updating erase target block information after an erase verify operation in the memory system according to the first embodiment.

Next, updating of the erase target block information after the erase verify operation will be described with reference to FIG. 6. FIG. 6 is a diagram showing an example of updating the erase target block information after the erase verify operation. The example shown in FIG. 6 omits information on the block BLK_ID0 in order to simplify the description.

As shown in FIG. 6, the erase manager 23 orders the NAND controller 26 to perform the erase verify operation on the string unit SU2 of the block BLK_ID1. After termination of the erase verify operation, the erase manager 23 updates the erase verify status information. For example, in the case where the erase verify has passed, the erase manager 23 updates the erase verify status information of the string unit SU2. In the case where the string unit SU3 has passed the erase verify, that is, all of the string units SU in the block BLK_ID1 concerned have passed the erase verify, the erase operation on the block BLK_ID1 concerned is terminated. In this case, the entry corresponding to the block BLK_ID1 concerned is deleted from the erase target block information.

In the case of failure of the erase verify, the erase manager 23 updates the erase voltage application accumulated time period information and the erase verify status information. More specifically, as shown in FIG. 6, in the case of the erase voltage application accumulated time period being equal to the erase voltage application target time period, the erase voltage application accumulated time period information is updated to "0" (that is, an initial value), and the erase verify status information is updated to "unexecuted". The erase manager 23 executes the erase voltage application operation on the block BLK_ID1 again based on the erase target block information.

For example, in the case where the erase voltage application accumulated time period at the time of failure of the erase verify is equal to or greater than the erase verify permission time period and less than the erase voltage application target time period, the erase manager 23 updates the erase voltage application accumulated time period information, the erase verify status information, the erase voltage application target time period information, and the erase verify permission time period information. More specifically, for example, the erase manager 23 updates the erase voltage application accumulated time period information to "0", and updates the erase verify status information to "unexecuted". Furthermore, the erase manager 23 updates a difference between the erase voltage application target time period and the erase voltage application accumulated time period before the update, as the erase voltage application target time period after the update, and updates the erase verify permission time period to "0". The erase manager 23 executes the erase voltage application operation on the block BLK again based on the erase target block information. In the case of the erase voltage application accumulated time period being "0", the erase manager 23 selects the erase voltage application operation even if the erase voltage application accumulated time period and the erase verify permission time period are equal to each other (both are "0"). This enables the erase voltage to be applied to the target block BLK until the erase voltage application target time period.

1.3 Relationship Between Timer Value and Erase Voltage Application Time Period

Figure 7:
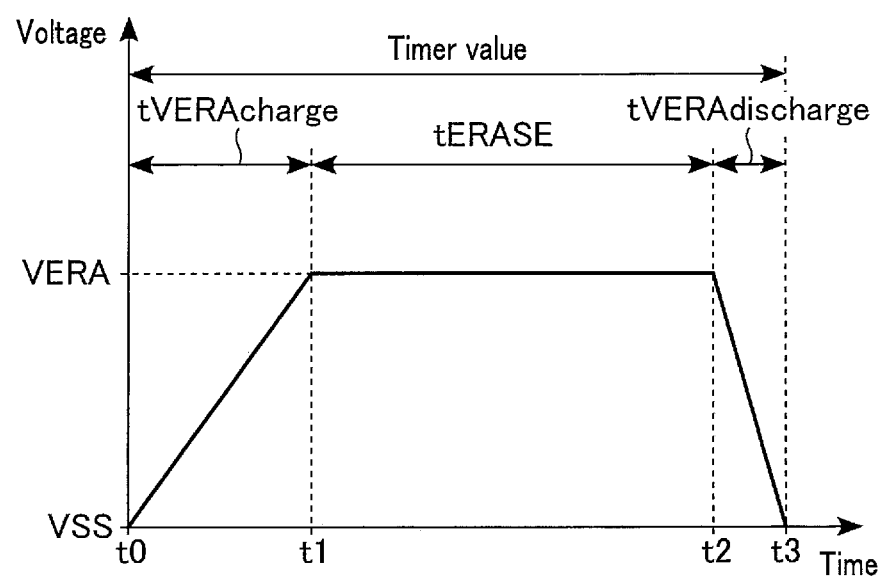
FIG. 7 is a graph showing a relationship between an erase voltage and a voltage application time period in the memory system according to the first embodiment.

Next, an example of a relationship between the timer value and the erase voltage application time period will be described with reference to FIG. 7. FIG. 7 is a graph showing a relationship between an erase voltage and a voltage application time period.

As shown in FIG. 7, an erase voltage VERA is applied to the source line SL in the erase voltage application operation.

More specifically, the time period between time t0 to time t1 is a time period during which the voltage VERA rises. Hereinafter, this time period will be referred to as a "time period tVERAcharge".

The time period from the time t1 to time t2 is a time period during which the voltage VERA is applied to the source line SL. This time period corresponds to the erase voltage application set time period. During this time period, a voltage smaller than the voltage VERA is applied to the word line WL of the erase target block BLK. Then, electrons are drawn out from the charge storage layer of the memory cell transistor MC based on a voltage difference between the voltage VERA and a voltage of the word line WL, so that the threshold voltage decreases. Hereinafter, this time period will be referred to as a "time period tERASE".

The time period from the time t2 to time t3 is a time period during which the voltage VERA falls. Hereinafter, this time period will be referred to as a "time period tVERAdischarge".

The timer value includes the time period from time t0 to time t3. That is, the ready/busy signal RBn is set to the "L" level from the time t0 to the time t3. Upon receipt of a timer value from the timer 24, the erase manager 23 subtracts a predetermined correction value from the timer value. The correction value is a total time period of the assumed time periods tVERAcharge and tVERAdischarge. The erase manager 23 adds the subtracted value, as the erase voltage application time period (time period tERASE), to the erase voltage application accumulated time period.

Figure 8:
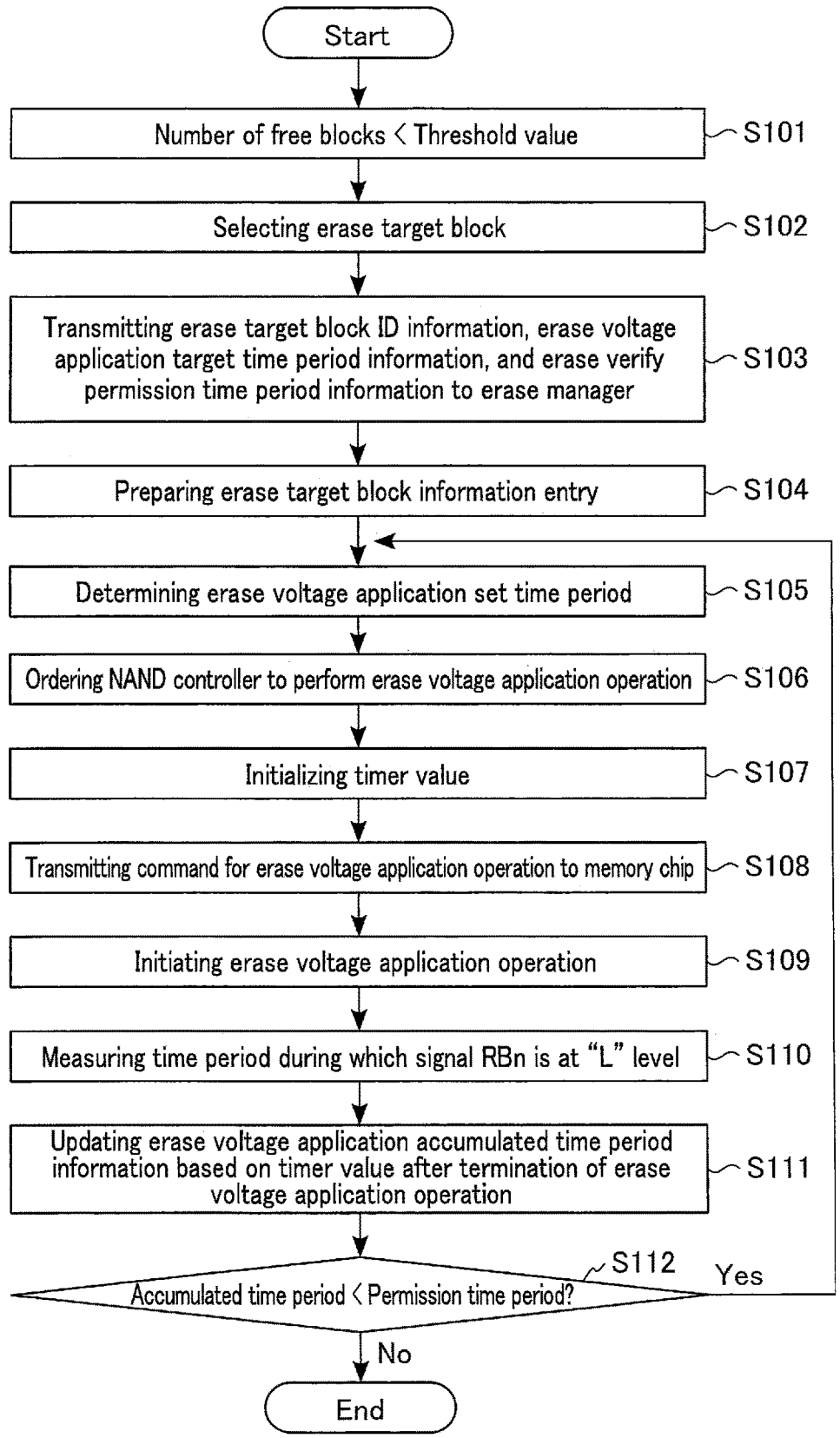
FIG. 8 is a flowchart of the erase voltage application operation in the memory system according to the first embodiment.

1.4 Erase Voltage Application Operation 1.4.1 Overall Flow of Erase Voltage Application Operation Next, an example of the overall flow of the erase voltage application operation will be described with reference to FIG. 8. FIG. 8 is a flowchart of the erase voltage application operation.

As shown in FIG. 8, the block manager 22 manages the number of free blocks. In response to the number of free blocks falling below the threshold value (S101), the block manager 22 selects the erase target block BLK (S102).

The block manager 22 transmits the erase target block ID information, the erase voltage application target time period information, and the erase verify permission time period information to the erase manager 23 (S103).

Regarding the erase target block information, the erase manager 23 prepares an entry of the erase target block information corresponding to the information received from the block manager 22 (S104).

The erase manager 23 selects which block BLK to execute the erase voltage application operation on, with reference to the erase target block information. The erase manager 23 determines the erase voltage application set time period with reference to the erase target block information (S105). The erase manager 23 sets a difference between the erase voltage application target time period and the erase voltage application accumulated time period to the erase voltage application set time period.

The erase manager 23 orders the NAND controller 26 to perform the erase voltage application operation on the select block BLK (S106).

The NAND controller 26 causes the timer 24 to initialize the timer value (S107).

The NAND controller 26 issues a command for the erase voltage application operation. The NAND controller 26 then transmits a command for the erase voltage application operation to the memory chip 11 including the selected block BLK (S108). More specifically, the NAND controller 26 issues a command set for the erase voltage application operation. The command set for the erase voltage application operation includes a command for the erase voltage application operation, an address of the selected block BLK, and the erase voltage application set time period data. The NAND controller 26 transmits the command set for the erase voltage application operation to the memory chip 11.

The memory chip 11 initiates the erase voltage application operation on the selected block BLK (S109).

The timer 24 measures a time period during which the ready/busy signal RBn received from the memory chip 11 is at the "L" level (S110). More specifically, in response to the ready/busy signal becoming the "L" level after the memory chip 11 initiates the erase voltage application, the NAND controller 26 initiates counting-up of the timer 24. In response to the ready/busy signal becoming the "H" level after the memory chip 11 terminates the erase voltage application operation, the NAND controller 26 causes the timer 24 to terminate counting-up.

Upon termination of the erase voltage application operation on the memory chip 11, the timer 24 transmits the timer value to the erase manager 23. The erase manager 23 updates the erase voltage application accumulated time period information based on the timer value (S111). More specifically, the erase manager 23 calculates the erase voltage application time period from the timer value. The erase manager 23 adds the calculated erase voltage application time period to the erase voltage application accumulated time period.

The erase manager 23 compares the erase voltage application accumulated time period with the erase verify permission time period (S112).

In the case where the erase voltage application accumulated time period is less than the erase verify permission time period (S112_Yes), the erase manager 23 proceeds to S105 in order to execute the erase voltage application operation again. The erase manager 23 determines the erase voltage application set time period from a difference between the erase voltage application target time period and the erase voltage application accumulated time period.

On the other hand, in the case of the erase voltage application accumulated time period being equal to or greater than the erase verify permission time period (S112_No), the erase manager 23 terminates the erase voltage application operation.

1.4.2 Command Sequence of Erase Voltage Application Operation

Figure 9:
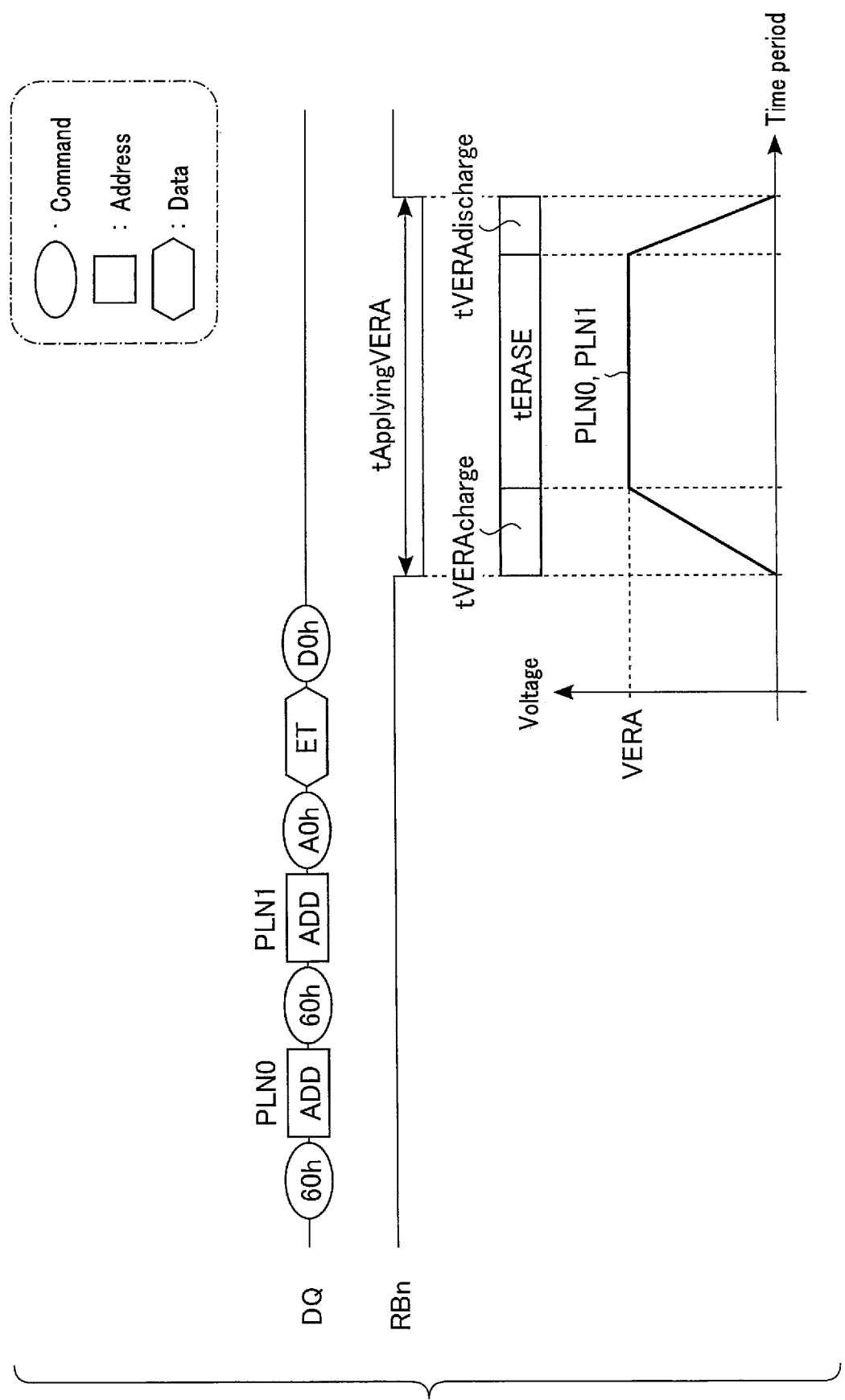
FIG. 9 shows a command sequence of the erase voltage application operation in the case where it is performed on a selected block BLK of a plane PLN0 and on a selected block BLK of a plane PLN1 simultaneously in the memory system according to the first embodiment.

Next, an example of the command sequence of the erase voltage application operation will be described with reference to FIG. 9. FIG. 9 shows the command sequence of the erase voltage application operation in the case where it is performed on the selected block BLK of the plane PLN0 and on the selected block BLK of the plane PLN1 simultaneously. It suffices that the number of selected planes PLN is one or more.

As shown in FIG. 9, the NAND controller 26 transmits the command set for the erase voltage application operation to the memory chip 11. More specifically, first, the NAND controller 26 transmits a command "60h" and the address ADD, each corresponding to the plane PLN0. The command "60h" is a command for notifying transmission of an address of the selected block BLK in the erase voltage application operation. Next, the NAND controller 26 transmits the command "60h" and the address ADD, each corresponding to the plane PLN1. Next, the NAND controller 26 transmits a command "A0h" and the erase voltage application set time period ET to the memory chip 11. The command "A0h" is a command for notifying transmission of the erase voltage application set time period ET. Next, the NAND controller 26 transmits the command "D0h" to the memory chip 11. The command "D0h" is a command for instructing the execution of the erase voltage application operation.

Upon receipt of the command "D0h", the sequencer 109 sets the ready/busy signal RBn to the "L" level, and initiates the erase voltage application operation on the planes PLN0 and PLN1.

Upon termination of the erase voltage application operation, the sequencer 109 sets the ready/busy signal RBn to the "H" level. Hereinafter, in the memory chip 11, the time period during which the ready/busy signal RBn is set to the "L" level in association with the erase voltage application operation will be referred to as "tAPPlyingVERA". The time period tApplyingVERA and the timer value in the memory controller 20 are approximately equal to each other.

1.5 Erase Verify Operation 1.5.1 Status in Erase Verify Operation

First, an example of the status in the erase verify operation will be described with reference to FIG. 10. FIG. 10 is a status transition diagram showing statuses of the erase verify operation.

As shown in FIG. 10, for example, a status of the erase verify operation is divided into four statuses, "erase verify unexecuted", "erase verify partially passed", "erase verify fully passed", and "erase verify failed".

The status "examination verify unexecuted" indicates that the erase verify operation has not been executed on the erase target block BLK. For example, the erase manager 23 sets the erase verify status information to "unexecuted".

The status "erase verify partially passed" indicates that some of the string units SU in the erase target block BLK have executed and as a result, passed the erase verify operation. The string units SU targeted for the erase verify operation are counted up in order of the string units SU0, SU1, . . . . In response to the erase verify being passed, the status of the erase target block BLK transitions from the status "erase verify unexecuted" to the status "erase verify partially passed". The string units SU targeted for the erase verify operation maintain the status "erase verify partially passed" while they are counted up and are passing the erase verify. For example, the erase manager 23 stores information on the string unit SU that has passed the erase verify, as the erase verify status information.

The status "erase verify fully passed" indicates that all of the string units SU (for example, the string units SU0 to SU3) in the erase target blocks BLK have passed the erase verify. In response to all of the string units SU in the erase target block BLK having passed the erase verify, the status of the erase target block BLK transitions from the status "erase verify partially passed" to the status "erase verify fully passed". The erase operation in this block BLK concerned is then completed. For example, the erase manager 23 deletes information on the block BLK concerned from the erase target block information.

The status "erase verify failed" indicates that the erase verify operation has been executed on any one of the string units SU in the erase target block BLK and the result is that the erase verify has failed. If any one string unit SU fails the erase verify, the erase verify operation is not executed on the subsequent string units SU. The status of the erase target block BLK transitions from the status "erase verify unexecuted" or "erase verify partially passed" to the status "erase verify failed". For example, the erase manager 23 sets the erase voltage application accumulated time period of the block BLK concerned to "0" (initial value) and sets the erase verify status information to "unexecuted". As a result, the status of the block BLK to be erased, which is "erase verify failed", is set to "erase verify unexecuted" and the erase voltage application operation is executed again thereon.

1.5.2 Flow of Erase Verify Operation

Figure 11:
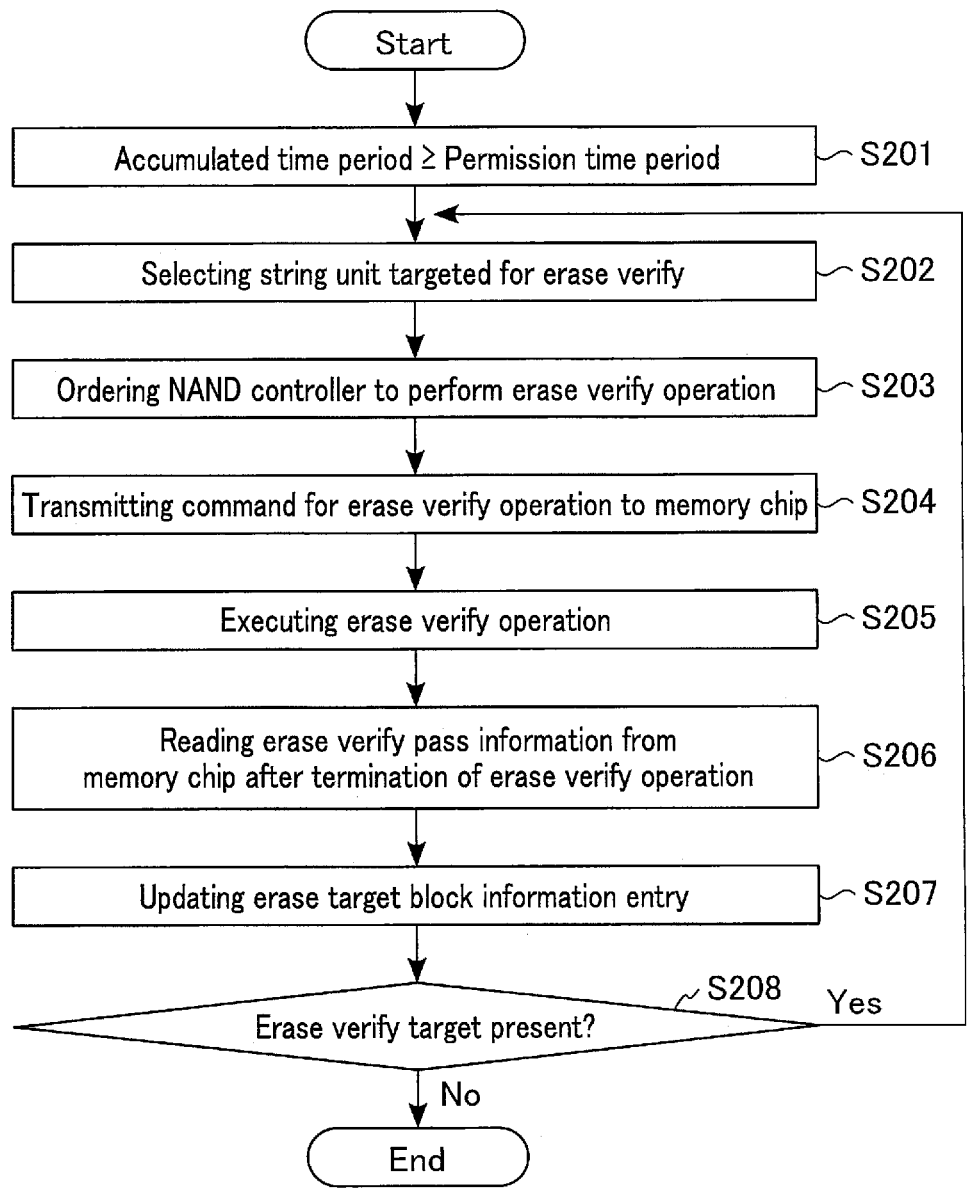
FIG. 11 is a flowchart of the erase verify operation in the memory system according to the first embodiment.

Next, an example of the overall flow of the erase verify operation will be described with reference to FIG. 11. FIG. 11 is a flowchart of the erase verify operation.

As shown in FIG. 11, in the case where the erase target block exhibiting an erase voltage application accumulated time period equal to or greater than the erase verify permission time period is found with reference to the erase target block information (S201), the erase manager 23 selects the string unit SU to execute the erase verify operation (S202). Hereinafter, the selected string unit SU will be referred to as a "selected string unit."

The erase manager 23 orders the NAND controller 26 to perform the erase verify operation on the selected string unit SU (S203).

The NAND controller 26 issues a command for the erase verify operation. The NAND controller 26 then transmits the command for the erase verify operation to the memory chip 11 including the selected string unit SU (selected block BLK) (S204). More specifically, the NAND controller 26 issues a command set for the erase verify operation. The command set for the erase verify operation includes a command for the erase verify operation and an address of the selected string unit SU. The NAND controller 26 transmits the command set for the erase verify operation to the memory chip 11.

The memory chip 11 executes the erase verify operation (S205).

Upon termination of the erase verify operation in the memory chip 11, the erase manager 23 reads the erase verify pass information EV from the memory chip 11 (S206).

The erase manager 23 updates the erase target block information based on the erase verify pass information EV read from the memory chip 11 (S207).

The erase manager 23 refers to the erase target block information to confirm whether the block BLK (string unit SU) targeted for the erase verify operation is present or absent (S208).

In the case where the string unit SU (block BLK) targeted for the erase verify operation is present (S208_Yes), the erase manager 23 proceeds to S202 and selects the string unit SU targeted for the erase verify operation.

On the other hand, in the case where a block BLK targeted for the erase verify operation is absent (S208_No), the erase manager 23 terminates the erase verify operation.

1.5.3 Command Sequence of Erase Verify Operation

Figure 12:
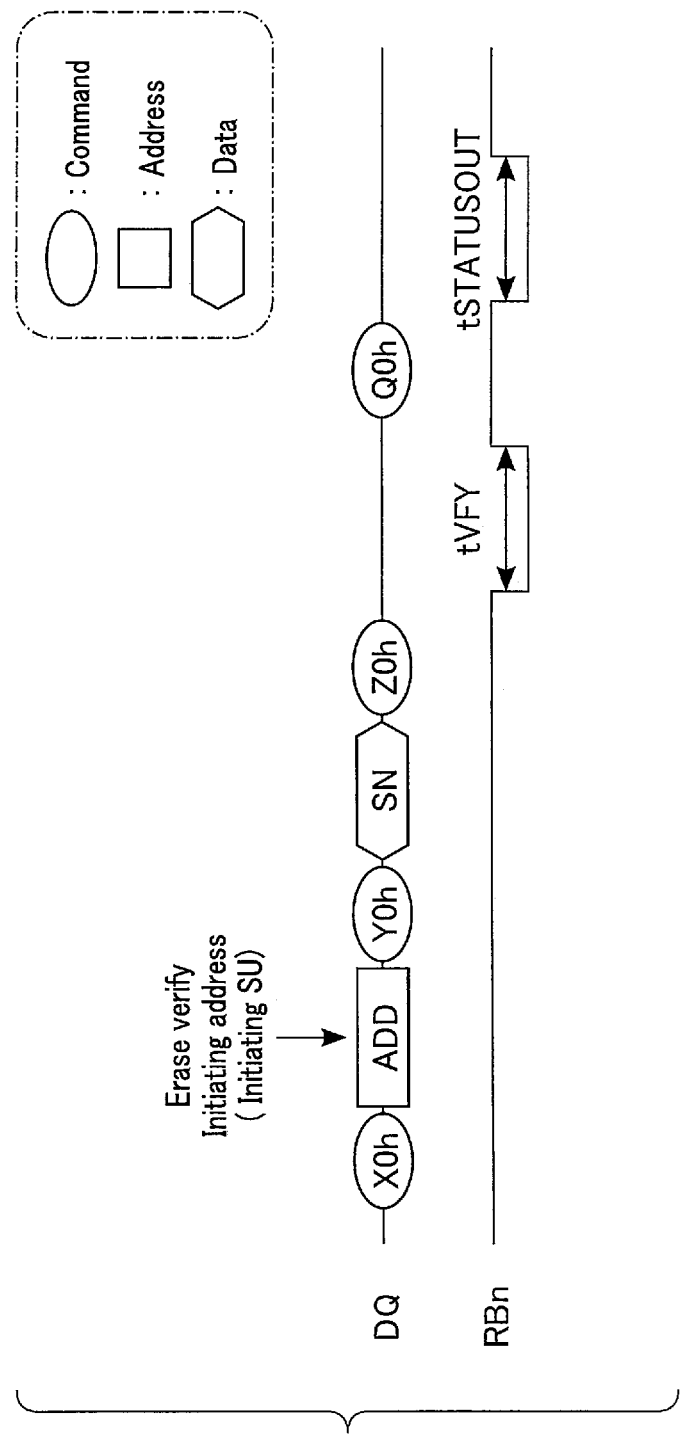
FIG. 12 is a command sequence of the erase verify operation in the memory system according to the first embodiment.

Next, an example of the command sequence of the erase verify operation will be described with reference to FIG. 12. FIG. 12 is a command sequence of the erase verify operation.

As shown in FIG. 12, the NAND controller 26 transmits a command set for the erase verify operation to the memory chip 11. More specifically, first, the NAND controller 26 transmits a command "X0h" and the address ADD. The command "X0h" is a command for notifying transmission of the address ADD of the string unit SU that initiates the erase verify operation (hereinafter also referred to as an "initiating string unit SU"). Next, the NAND controller 26 transmits a command "Y0h" and the string unit number data SN. The command "Y0h" is a command for notifying transmission of the string unit number data SN regarding the number of string units SU that execute the erase verify operation. Next, the NAND controller 26 transmits a command "Z0h" to the memory chip 11. The command "Z0h" is a command for instructing execution of the erase verify operation.

Upon receipt of the command "Z0h", the sequencer 109 sets the ready/busy signal RBn to the "L" level. The sequencer 109 repeats the erase verify operation the number of times designated by the string unit number data SN while counting up the number assigned to the string unit SU from the initiating string unit SU.

Upon termination of the erase verify operation, the sequencer 109 sets the ready/busy signal RBn to the "H" level. Hereinafter, in the memory chip 11, the time period during which the ready/busy signal RBn is set to the "L" level in association with the erase verify operation will be referred to as "tVFY".

After the time period tVFY has elapsed, upon confirmation of the ready/busy signal RBn being the "H" level, the NAND controller 26 transmits a command "Q0h" to the memory chip 11. The command "Q0h" is a command for requesting reading of the erase verify pass information EV.

Upon receipt of the command "Q0h", the sequencer 109 sets the ready/busy signal RBn to the "L" level and initiates output of the erase verify pass information EV. Upon termination of output of the erase verify pass information EV, the sequencer 109 sets the ready/busy signal RBn to the "H" level. Hereinafter, in the memory chip 11, the time period during which the ready/busy signal RBn is set to the "L" level in association with the read request for the erase verify pass information EV will be referred to as "tSTATUSOUT".

Figure 13:
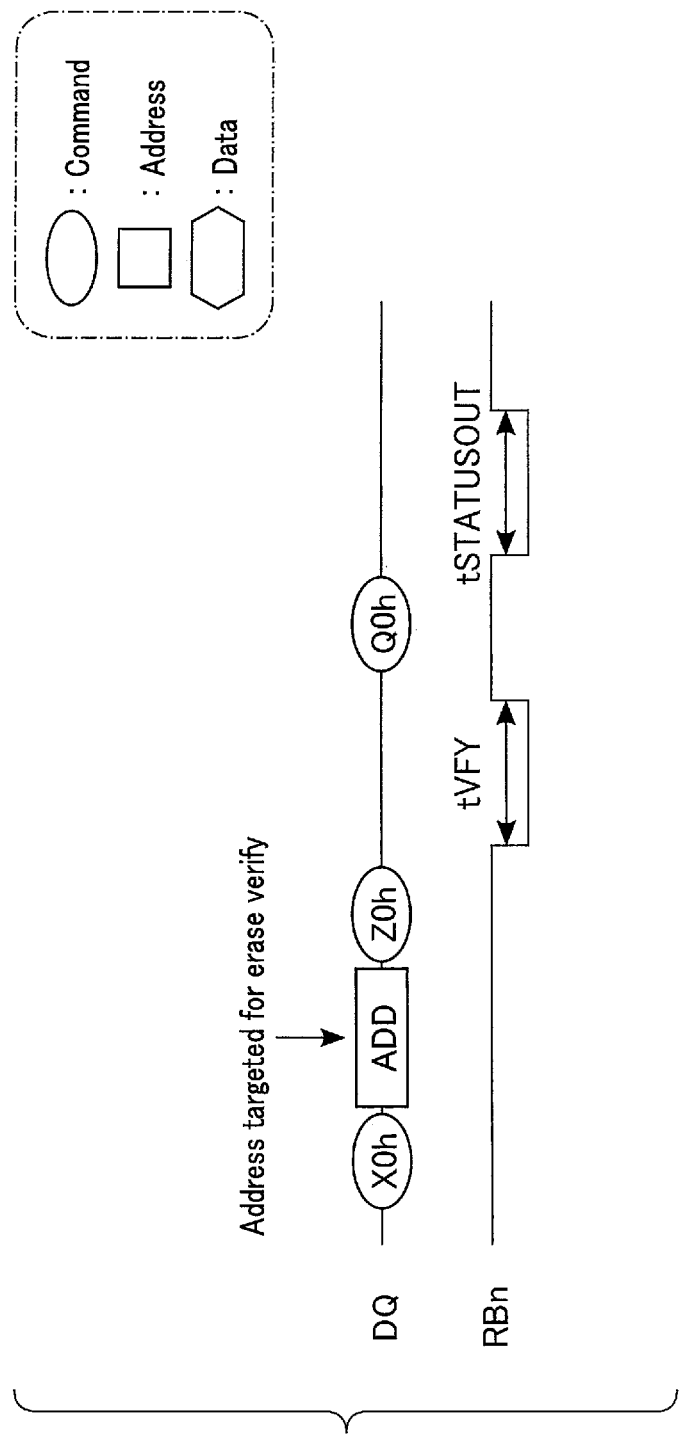
FIG. 13 is a command sequence of the erase verify operation in the case where the number of string units targeted for the erase verify operation is one in the memory system according to the first embodiment.

In the case where the number of string units SU targeted for the erase verify operation is one, the command "Y0h" and the string unit number data SN may be omitted as shown in FIG. 13.

1.5.4 Flowchart of Erase Verify Operation in Memory Chip

Figure 14:
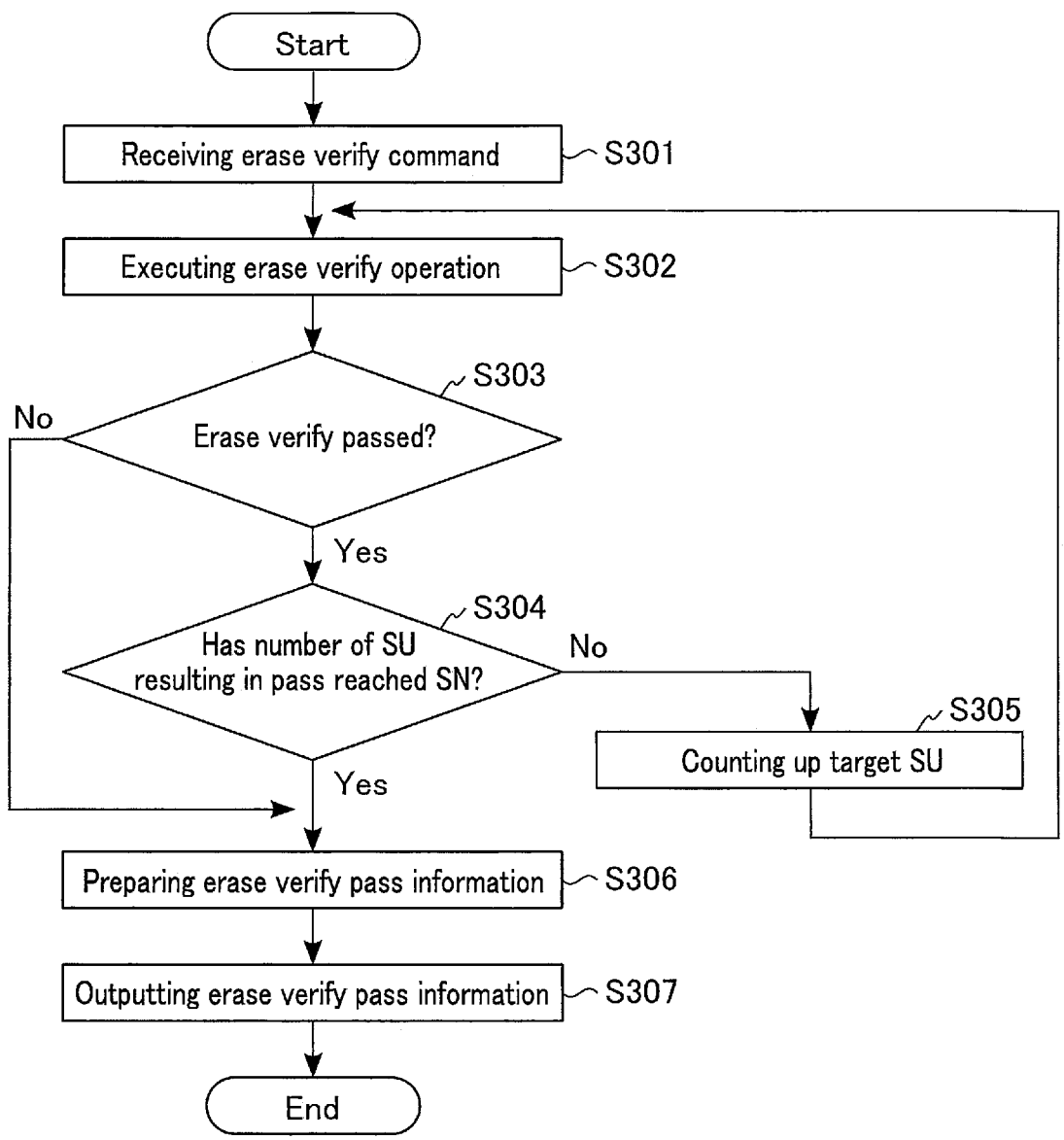
FIG. 14 is a flowchart of the erase verify operation in the memory chip according to the first embodiment.

Next, an example of the flowchart of the erase verify operation in the memory chip 11 will be described with reference to FIG. 14. FIG. 14 is a flowchart of the erase verify operation in the memory chip 11.

As shown in FIG. 14, the sequencer 109 receives the command "Z0h" for instructing execution of the erase verify operation from the NAND controller 26 (S301).

The sequencer 109 executes the erase verify operation (S302).

In the case where the erase verify has passed (S303_Yes), the sequencer 109 confirms the number of string units that have passed the erase verify operation (S304).

In the case where the number of string units that have passed the erase verify operation has not reached the string unit number data SN (S304_No), the sequencer 109 counts up the number assigned to the string unit SU targeted for the erase verify operation (S305). The sequencer 109 proceeds to S302 to execute the erase verify operation on the counted-up string unit SU.

In the case where the erase verify has failed in S303 (S303_No) or the case where the number of string units has reached the string unit number data SN (S304_Yes), the sequencer 109 prepares the erase verify pass information EV (S306).

Upon receipt of the command "Q0h" for the NAND controller 26, the sequencer 109 outputs the erase verify pass information EV to the memory controller 20.

1.6 Advantageous Effect of Present Embodiment

The configuration according to the present embodiment can improve a processing capability of the memory system. Hereinafter, such advantageous effects will be described in detail.

For example, in the erase operation, the erase voltage application operation and the erase verify operation are repeatedly executed until data erasure is completed. The erase verify operation is executed in units of string units. Thus, as the number of string units included in one block BLK increases, a time period for processing the erase verify operation increases. This causes a tendency for the erase operation to be longer in terms of its processing time period than the write operation or the read operation.

For example, the erase operation may be suspended during its execution in order to prioritize execution of the write operation or the read operation. As the time period for processing the erase operation increases, the possibility of causing suspension increases. For example, in the case where the write operation is executed by suspending the erase operation, the read operation cannot be executed by further suspending the write operation. That is, another suspension in addition to one suspension is not allowed.

For example, in the case where the erase operation is executed on the plurality of planes PLN simultaneously, the erase operation is not completed until all of these planes PLN have passed the erase verify. Thus, even if a plane PLN has passed the erase verify, the plane PLN that has passed the erase verify is brought into a standby state until another plane PLN passes the erase verify. This impairs processing efficiency of the erase operation. More specifically, for example, in the case where the erase operation is executed on the planes PLN0 and PLN1, the first erase voltage application operation is executed on the planes PLN0 and PLN1 simultaneously. For example, in the subsequent first erase verify operation, assume that the first to last string units SU have passed the erase verify in the plane PLN0 while the string unit SU0 has failed the erase verify in the plane PLN1. In this case, the plane PLN1 is brought into the standby state until the erase verify operation on the plane PLN0 is terminated. After termination of the erase verify operation on the plane PLN0, in the plane PLN1 that has failed the erase verify, the second erase voltage application operation and erase verify operation are executed continuously. During this execution, the plane PLN0 is brought into the standby state because it has passed the erase verify, until the plane PLN1 passes the erase verify.

On the other hand, the configuration according to the present embodiment enables the memory system 3 to execute the erase voltage application and the erase verify operation independently of each other on the memory chip 11. Furthermore, this configuration enables the erase verify operation to be independently executed for each string unit SU. That is, the processing of the erase operation can be dispersed. This can reduce a frequency of occurrence of suspension. Thus, this can reduce the possibility that another suspension in addition to one suspension will be needed. Furthermore, this can prevent occurrence of a standby time period caused by the erase operation. For example, in the case where the erase voltage application operation is executed on the planes PLN0 and PLN1 and the plane PLN1 fails the erase verify, the plane PLN0 can be selected in the next erase voltage application operation. This can prevent occurrence of a standby time period in the plane PLN0. Thus, a processing capability of the memory system 3 can be improved.

2. Second Embodiment

Next, a second embodiment will be described. In the second embodiment, the case in which the erase voltage application operation is executed by selecting the plurality of blocks BLK in one plane PLN will be described. Hereinafter, the matters different from the first embodiment will be mainly described.

2.1 Erase Target Block Information

First, an example of erase target block information will be described with reference to FIG. 15. FIG. 15 is an example of the erase target block information table.

As shown in FIG. 15, for example, entries for the blocks BLK_ID0 and BLK_ID1 are prepared. For example, the block BLK_ID0 corresponds to the block BLK0 of the plane PLN0. The block BLK_ID1 corresponds to the block BLK1 of the plane PLN0. In this condition, for example, the erase voltage application accumulated time period in the blocks BLK_ID0 and BLK_ID1 is "0". The erase voltage application accumulated time period "0" is less than the erase verify permission time period "TB". The erase manager 23 orders the NAND controller 26 to perform the erase voltage application operation on each of the blocks BLK_ID0 and BLK_ID1 based on the erase target block information. In other words, the erase manager 23 orders the NAND controller 26 to perform the erase voltage application operation on each of the blocks BLK0 and BLK1 of the plane PLN0. The erase manager 23 compares a difference between the erase voltage application target time period "TA" and the erase voltage application accumulated time period "0" in the block BLK_ID0 ("TA"–"0") with a difference between the erase voltage application accumulated time period "TA" and the erase voltage application target time period "0" in the block BLK_ID1 ("TA"–"0"). The erase manager 23 sets the smaller difference between the erase voltage application target time period and the erase voltage application accumulated time period to the erase voltage application set time period.

2.2 Relationship Between Timer Value and Erase Voltage Application Time

Figure 16:
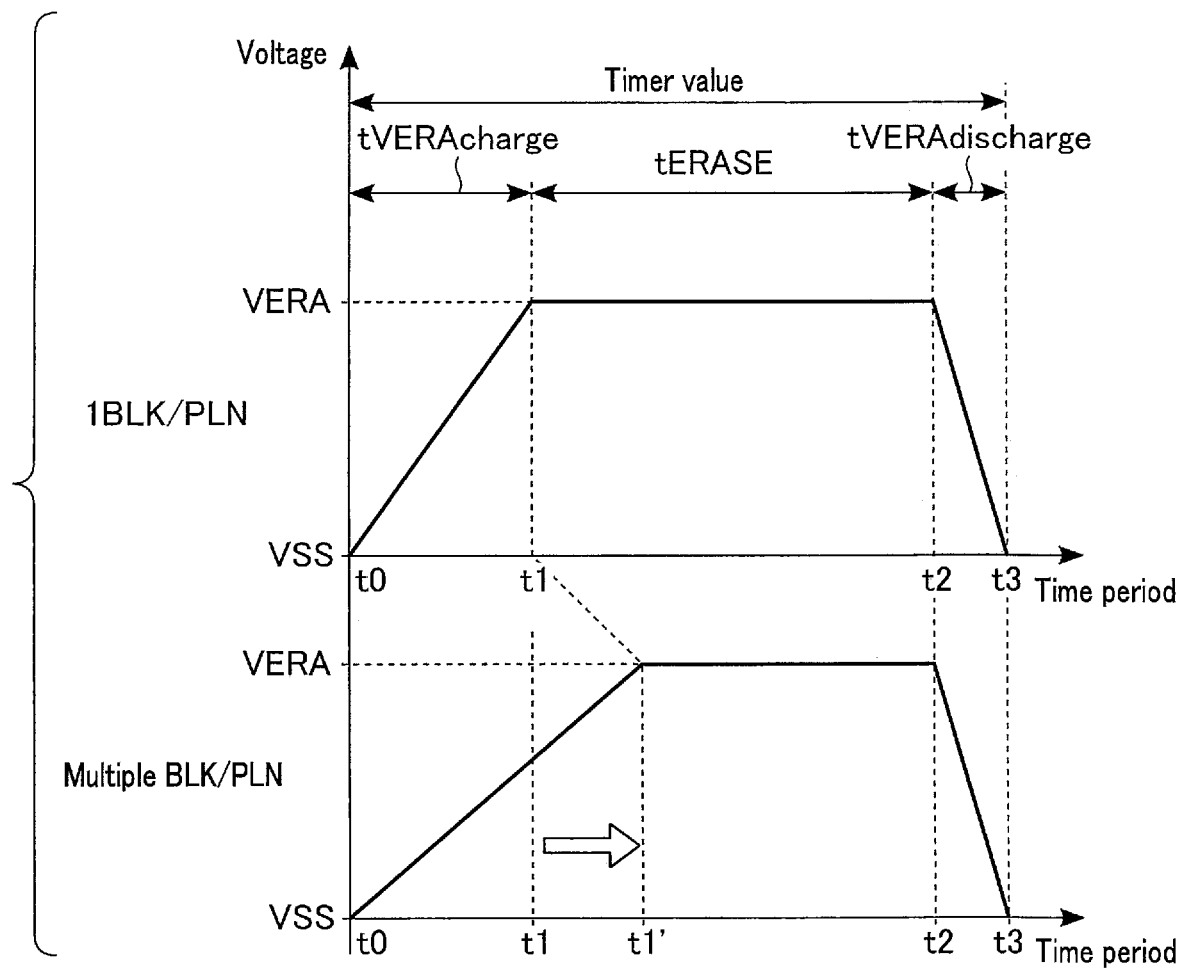
FIG. 16 is a graph showing a relationship between an erase voltage and a voltage application time period in the memory system according to the second embodiment.

Next, an example of a relationship between the timer value and the erase voltage application time period will be described with reference to FIG. 16. FIG. 16 is a graph showing a relationship between an erase voltage and a voltage application time period.

As shown in FIG. 16, the time tVERAcharge varies depending on the number of blocks BLK selected in the plane PLN. In the case where one block BLK is selected from one plane PLN, the time period from the time t0 to the time t1 corresponds to the time period tVERAcharge. Furthermore, in the case where the plurality of blocks BLK are selected from one plane PLN, the time period from the time t0 to the time t1' corresponds to the time tVERAcharge. A comparison of the time period from the time t0 to the time t1 with the time period from the time t0 to the time t1' shows that the time period from the time t0 to the time t1' is longer.

That is, as the number of blocks BLK selected in one plane PLN increases, the time period tVERAcharge tends to increase. Therefore, for example, even in the same timer time period, the erase voltage application set time period (time period tERASE) varies depending on the number of blocks BLK. Therefore, the erase manager 23 sets a correction value based on the number of blocks BLK selected in the plane PLN.

2.3 Command Sequence of Erase Voltage Application Operation

Next, an example of the command sequence of the erase voltage application operation will be described with reference to FIG. 17. The example shown in FIG. 17 is the command sequence of the erase voltage application operation in the case where the erase voltage application operation is executed on the blocks BLK0 and BLK1 simultaneously in the plane PLN0. It suffices that the number of selected planes BLK is two or more.

As shown in FIG. 17, the NAND controller 26 transmits the command "60h", the address ADD, and a command "DXh", each corresponding to the block BLK0 of the plane PLN0, to the memory chip 11. The command "DXh" is a command for instructing setting of the address ADD. Upon receipt of the command "DXh", the sequencer 109 sets the ready/busy signal RBn to the "L" level. The sequencer 109 sets the address ADD (row address RA) in the row decoder 113 of the target plane PLN. More specifically, for example, the row decoder 113 includes the plurality of latch circuits corresponding to the respective blocks BLK. The sequencer 109 causes the latch circuit corresponding to the address ADD (row address RA) to store data (a result of decoding the row address RA) indicating that the target block BLK has been selected. Upon termination of setting of the address ADD, the sequencer 109 sets the ready/busy signal RBn to the "H" level.

Upon receipt of the ready/busy signal RBn at the "H" level, the NAND controller 26 transmits the command "60h", the address ADD, and the command "DXh", each corresponding to the block BLK1 in the plane PLN0, to the memory chip 11. Upon receipt of the command "DXh", the sequencer 109 sets the ready/busy signal RBn to the "L" level, and sets the address ADD. Upon termination of setting of the address ADD, the sequencer 109 sets the ready/busy signal RBn to the "H" level.

Upon receipt of the ready/busy signal RBn at the "H" level, the NAND controller 26 transmits the command "A0h" and the erase voltage application set time period data ET to the memory chip 11. Next, the NAND controller 26 transmits a command "DYh" to the memory chip 11. The command "DYh" is a command for instructing execution of the erase voltage application operation on the plurality of blocks BLK.

Upon receipt of the command "DYh", the sequencer 109 sets the ready/busy signal RBn to the "L" level and initiates the erase voltage application operation on the blocks BLK0 and BLK1 of the plane PLN0.

Upon termination of the erase voltage application operation, the sequencer 109 sets the ready/busy signal RBn to the "H" level.

2.4 Advantageous Effect of Present Embodiment

The configuration of the present embodiment can attain the same effect as the first embodiment.

3. Third Embodiment

Next, the third embodiment will be described. In the third embodiment, the case in which the erase voltage application operation is executed on the blocks, each different in the erase voltage application accumulated time period, will be described. Hereinafter, the explanation will focus mainly on matters which differ from the first and second embodiments.

3.1 Erase Target Block Information

First, an example of the erase target block information will be described with reference to FIG. 18. FIG. 18 is an example of the erase target block information table.

As shown in FIG. 18, for example, entries for the blocks BLK_ID0 and BLK_ID1 are prepared. For example, the erase voltage application accumulated time period in the block BLK_ID0 is "TC". The erase voltage application accumulated time period "TC" is less than the erase verify permission time period "TB". Furthermore, the erase voltage application accumulated time period in the block BLK_ID1 is "0". Thus, the erase manager 23 orders the NAND controller 26 to perform the erase voltage application operation on the blocks BLK_ID0 and BLK_ID1. The erase manager 23 compares a difference between the erase voltage application target time period "TA" and the erase voltage application accumulated time period "TC" in the block BLK_ID0 ("TA"−"TC") and a difference between the erase voltage application target time period "TA" and the erase voltage application accumulated time period "0" in the block BLK_ID1 ("TA"−"0"). The erase manager 23 sets the smaller difference between the erase voltage application target time period and the erase voltage application accumulated time period ("TA"−"TC") to the erase voltage application set time period.

3.2 Advantageous Effect of Present Embodiment

The configuration of the present embodiment can attain the same effect as the first embodiment.

4. Fourth Embodiment

Next, a fourth embodiment will be described. In the fourth embodiment, the case in which the condition for applying the erase voltage is changed in the erase voltage application operation on the block BLK which has failed the erase verify in the state in which the erase voltage application accumulated time period has reached the erase voltage target time period is described. To simplify the description, the case in which the erase voltage application target time period and the erase verify permission time period are the same will be described below. Hereinafter, the matters different from the first to third embodiments will be mainly described.

4.1 Configuration of Memory System

Figure 19:
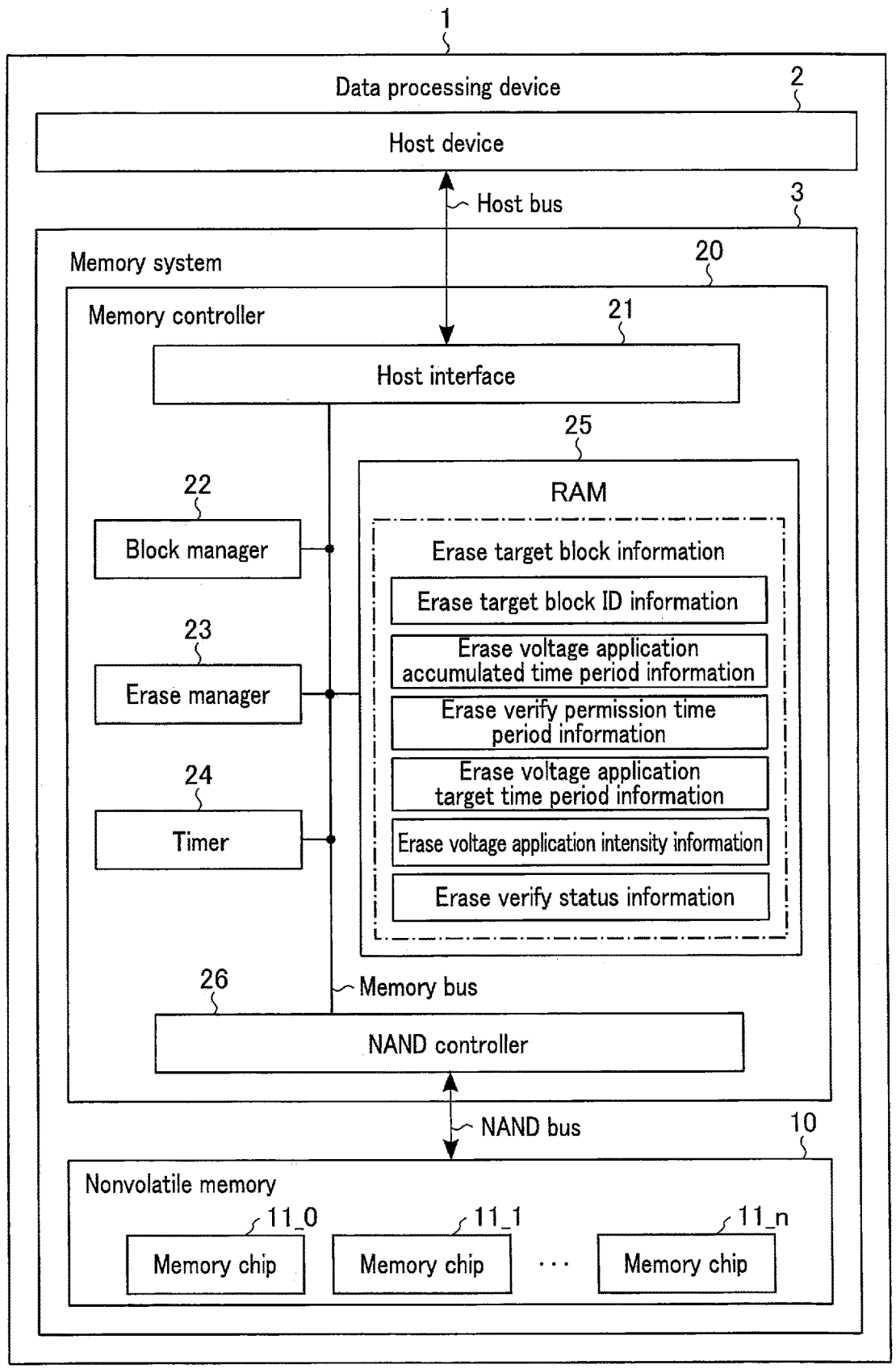
FIG. 19 is a block diagram showing an overall configuration of a data processing device including a memory system according to a fourth embodiment.

An example of the configuration of the memory system 3 will be described with reference to FIG. 19. FIG. 19 is a block diagram showing an overall configuration of the data processing device 1.

As shown in FIG. 19, the erase target block information in the present embodiment includes the erase target block ID information, the erase voltage application accumulated time period information, the erase verify permission time period information, the erase voltage application target time period information, erase voltage application intensity information, and the erase verify status information.

The erase voltage application intensity information is information regarding setting of the erase voltage application during the erase voltage application operation. The erase voltage application intensity corresponds to a set value of the erase voltage in the memory chip 11. In the present embodiment, an erase voltage is increased in the case where the erase verify has failed and the erase voltage application operation is repeated with the erase voltage application accumulated time period having reached the erase voltage target time period. An initial value of the erase voltage application intensity is, for example, "0". The erase voltage application intensity is incremented in accordance with repeated execution of the erase voltage application operation. The erase voltage application intensity may be the same as the number of times the erase voltage application operation is repeated on the erase target block BLK.

The rest of the configuration is similar to that shown in FIG. 1 described in the first embodiment.

4.2 Configuration of Memory Chip

Next, an example of the configuration of the memory chips 11 will be described with reference to FIG. 20. FIG. 20 is a block diagram of the memory chip 11.

As shown in FIG. 20, the memory chip 11 includes the input/output circuit 101, the logic controller 102, the erase timer register 103, the string unit number register 104, the erase verify status register 105, the status register 106, the address register 107, the command register 108, an erase voltage intensity register 120, the sequencer 109, the ready/busy circuit 110, the voltage generator 111, and the plurality of planes PLN.

The erase voltage intensity register 120 is a register configured to temporarily store erase voltage application intensity data VS received from the input/output circuit 101. The erase voltage intensity register 120 is coupled to the input/output circuit 101 and the sequencer 109. The erase voltage intensity register 120 transmits the erase voltage application intensity data VS to the sequencer 109.

For example, upon receipt of a command for the erase voltage application operation from the command register 108, the sequencer 109 reads the erase voltage application set time period data ET from the erase timer register 103. The sequencer 109 reads the erase voltage application intensity data VS from the erase voltage intensity register 120. The sequencer 109 sets the erase voltage based on the erase voltage application intensity data VS. Thereafter, the sequencer 109 performs the erase voltage application operation.

The rest of the configuration is similar to that shown in FIG. 2 described in the first embodiment.

4.3 Erase Target Block Information

Figure 21:
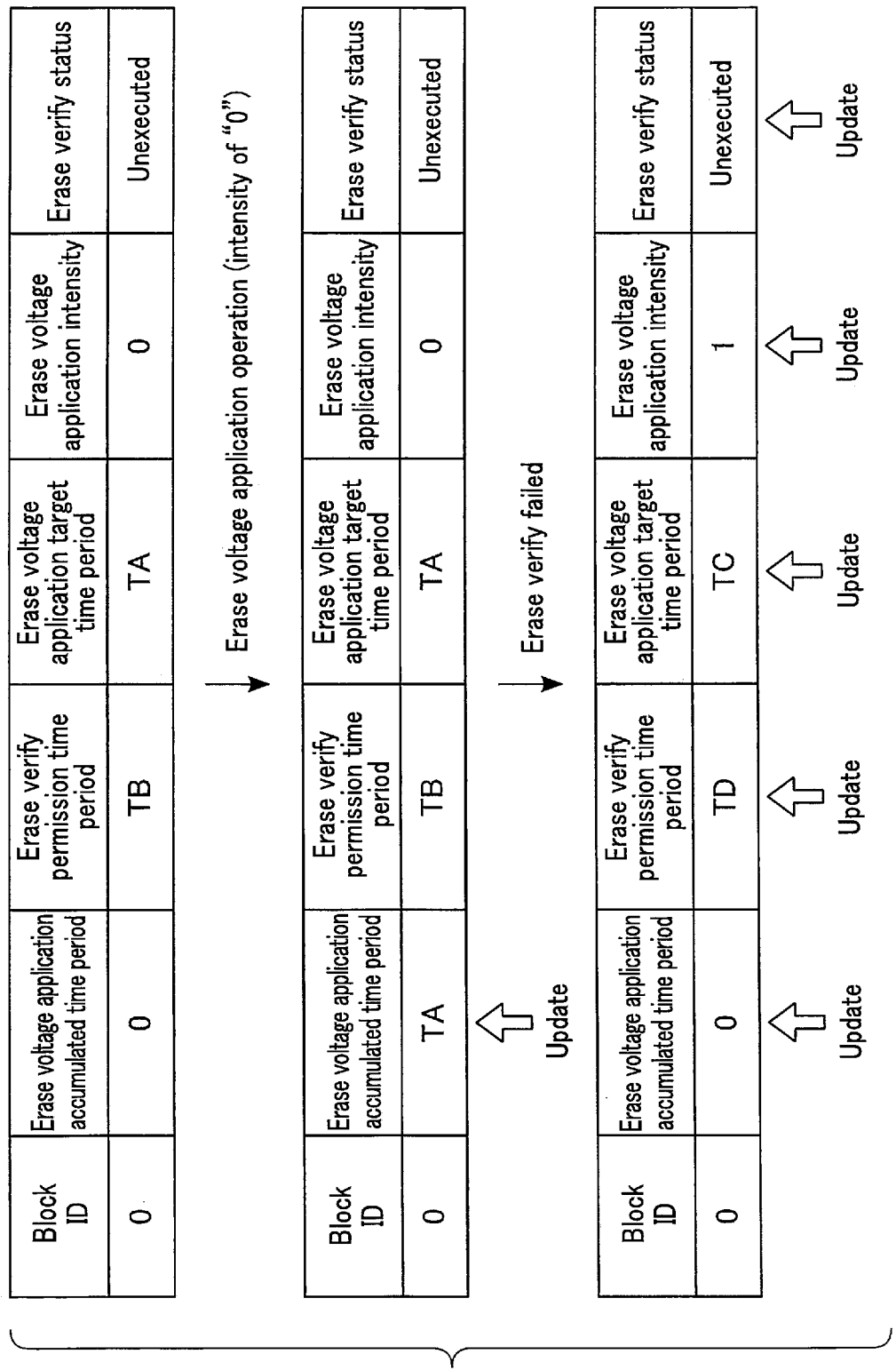
FIG. 21 is a diagram showing an example of updating erase target block information in the memory system according to the fourth embodiment.

Next, an example of erase target block information will be described with reference to FIG. 21. FIG. 21 is a diagram showing an example of updating the erase target block information.

As shown in FIG. 21, for example, the erase manager 23 receives from the block manager 22 information of the block ID="0", the erase voltage application target time period="TA", and the erase verify permission time period="TB". The erase manager 23 prepares an entry corresponding to the block BLK_ID0 based on the aforementioned information. At this time, the erase voltage application accumulated time period is set to "0", the erase voltage application intensity is set to "0", and the erase verify status information is set to "unexecuted".

First, the erase manager 23 orders the NAND controller 26 to perform the erase voltage application operation on the block BLK_ID0. As the erase voltage application condition in this case, the erase voltage application set time period ("TA"−"0") and the erase voltage application intensity of "0" are set.

After the erase voltage application operation, the erase manager 23 updates the erase voltage application accumulated time period to "TA". With the relationship of "TA"≥"TB", the erase manager 23 permits the erase verify operation on the block BLK_ID0.

Next, the erase manager 23 orders, for example, the NAND controller 26 to perform the erase verify operation on the string unit SU0. After termination of the erase verify operation, the erase manager 23 updates the erase verify status information. For example, in the case where the erase verify has failed with the erase voltage application accumulated time period having reached the erase voltage target time period, the erase manager 23 updates the erase voltage application accumulated time period information, the erase verify permission time period information, the erase voltage application target information, the erase voltage application intensity information, and the erase verify status information. More specifically, the erase voltage application accumulated time period information is updated to the initial value (that is, 0). The erase verify permission time period is updated to "TD". The erase verify permission time period may be "TB"="TD". That is, the erase verify permission time period may not be updated. The erase voltage application target time period is updated to "TC". The erase voltage application target time period may be "TA"="TC". That is, the erase voltage application target time period may not be updated. The erase voltage application intensity information is incremented from "0" to "1". The erase verify status information is updated to "unexecuted". The erase manager 23 executes the erase voltage application operation on the block BLK again based on the erase target block information. As the erase voltage application condition in this case, the erase voltage application set time period ("TC"–"0") and the erase voltage application intensity "1" are set.

4.4 Overall Flow of Erase Voltage Application Operation

Figure 22:
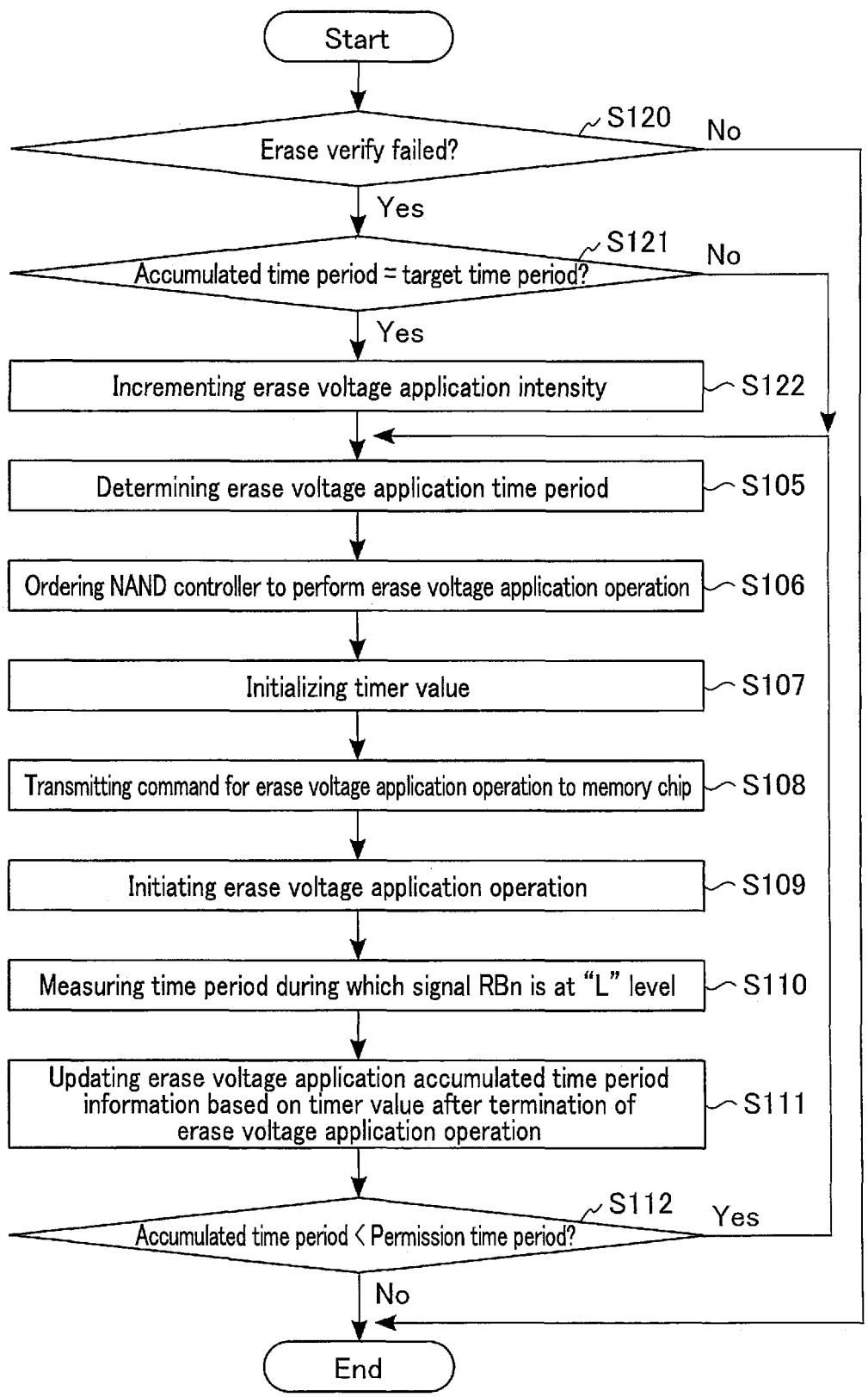
FIG. 22 is a flowchart of an erase voltage application operation after an erase verify has failed in the memory system according to the fourth embodiment.

Next, an example of the overall flow of the erase voltage application operation will be described with reference to FIG. 22. FIG. 22 is a flowchart of the erase voltage application operation after the erase verify has failed.

As shown in FIG. 22, in the case where the erase verify has not been failed (S120_No), the erase manager 23 does not execute the erase voltage application operation.

In the case where the erase verify has failed (S120_Yes), the erase manager 23 confirms whether or not the erase voltage application accumulated time period has reached the erase voltage application target time period (S121).

In the case where the erase voltage accumulated time period has reached the erase voltage application target time period (S121_Yes), the erase manager 23 increments the erase voltage application intensity in the erase target block information (S122). More specifically, the erase manager 23 updates the erase voltage application accumulated time period information, the erase verify permission time period information, the erase voltage application target information, the erase voltage application intensity information, and the erase verify status information.

In the case where the erase voltage application accumulated time period has not reached the erase voltage application target time period (S121_No), the erase manager 23 proceeds to S105 without incrementing the erase voltage application intensity. More specifically, the erase manager 23 proceeds to S105 after updating the erase voltage application accumulated time period information, the erase verify permission time period information, the erase voltage application target information, and the erase verify status information.

The erase manager 23 determines the erase voltage application set time period with reference to the erase target block information (S105). The erase manager 23 sets a difference between the erase voltage application target time period and the erase voltage application accumulated time period to the erase voltage application set time period. The rest of the operation subsequent to S106 is similar to that shown in FIG. 8 described in the first embodiment.

4.5 Command Sequence of Erase Voltage Application Operation

Next, two examples of the command sequence of the erase voltage application operation will be described.

4.5.1 Command Sequence of Erase Voltage Application Operation in Case of Selecting Multiple Planes As the first example, a command sequence of the erase voltage application operation in the case of selecting the plurality of planes PLN will be described first with reference to FIG. 23. FIG. 23 shows the command sequence of the erase voltage application operation in the cases in which it is performed on the selected block BLK of the plane PLN0 and on the selected block BLK of the plane PLN1 simultaneously. It suffices that the number of selected planes PLN is two or more.

As shown in FIG. 23, the NAND controller 26 transmits the command set for the erase voltage application operation to the memory chip 11. More specifically, first, the NAND controller 26 transmits the command "60h" and the address ADD, each corresponding to the plane PLN0. Next, the NAND controller 26 transmits the command "60h" and the address ADD, each corresponding to the plane PLN1. Next, the NAND controller 26 transmits the command "A0h" and the erase voltage application set time period ET to the memory chip 11. Next, the NAND controller 26 transmits a command "B0h" and the erase voltage application intensity data VS to the memory chip 11. The command "B0h" is a command for notifying transmission of the erase voltage application intensity data VS. Next, the NAND controller 26 transmits the command "D0h" to the memory chip 11.

Upon receipt of the command "D0h", the sequencer 109 sets the ready/busy signal RBn to the "L" level, and initiates the erase voltage application operation on the planes PLN0 and PLN1. At this time, the erase voltage is set based on the erase voltage application intensity data VS.

Upon termination of the erase voltage application operation, the sequencer 109 sets the ready/busy signal RBn to the "H" level.

Figure 24:
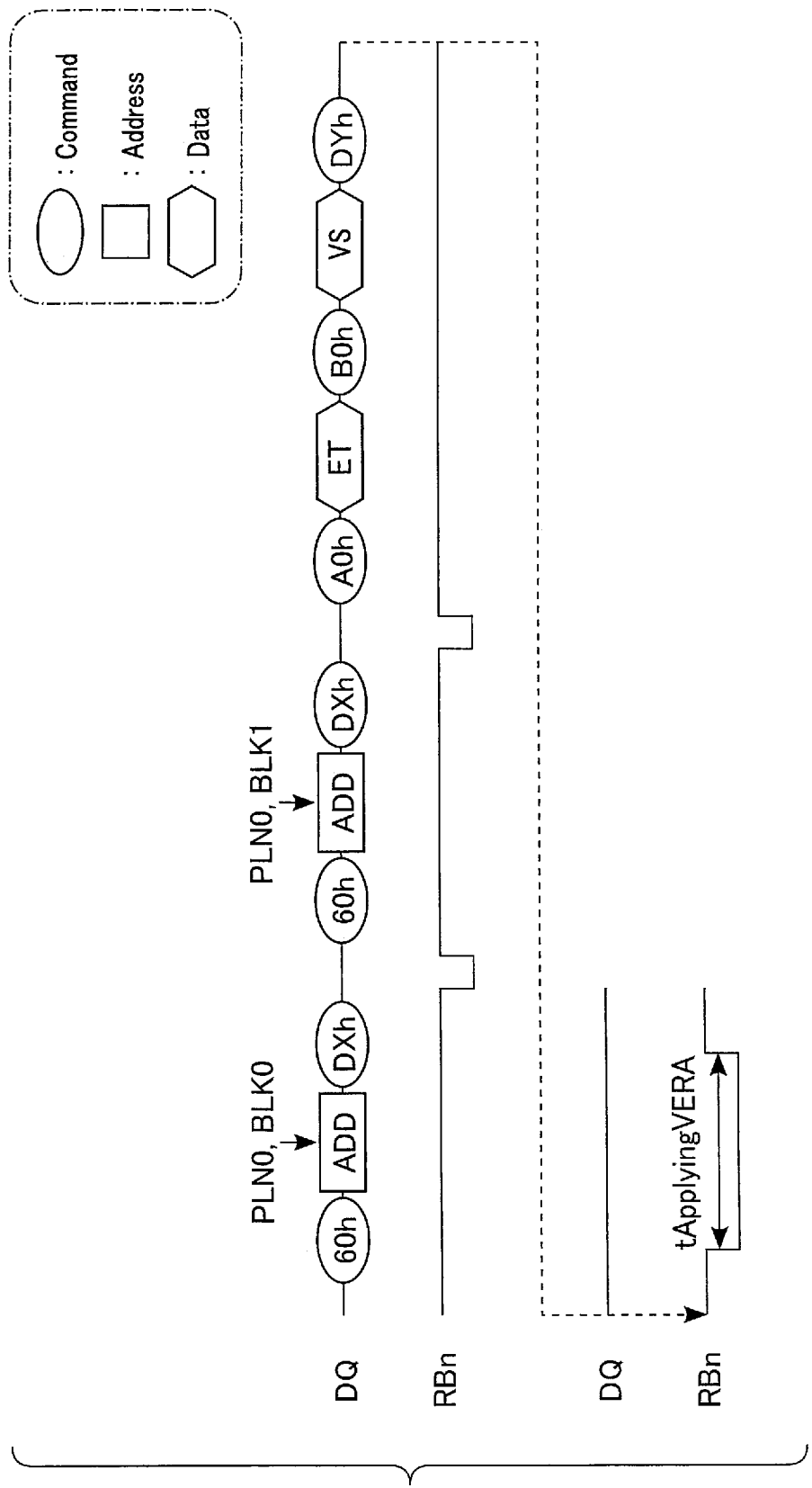
FIG. 24 shows a command sequence of the erase voltage application operation in a case where it is performed on blocks BLK0 and BLK1 of a plane PLN0 simultaneously in the memory system according to the fourth embodiment.

4.5.2 Command Sequence of Erase Voltage Application Operation in Case of Selecting Multiple Blocks in Single Plane Next, as the second example, a command sequence of the erase voltage application operation in the case of selecting the plurality of blocks BLK in the single plane PLN will be described with reference to FIG. 24. FIG. 24 is the command sequence of the erase voltage application operation in the case where the erase voltage application operation is performed on the blocks BLK0 and BLK1 in the plane PLN0 simultaneously. It suffices that the number of selected planes BLK is two or more.

As shown in FIG. 24, the NAND controller 26 transmits the command "60h", the address ADD, and the command "DXh", each corresponding to the block BLK0 of the plane PLN0, to the memory chip 11. Upon receipt of the command "DXh", the sequencer 109 sets the ready/busy signal RBn to the "L" level. The sequencer 109 sets the address ADD (row address RA) in the row decoder 113 of the target plane PLN. Upon termination of setting of the address ADD, the sequencer 109 sets the ready/busy signal RBn to the "H" level.

Upon receipt of the ready/busy signal RBn at the "H" level, the NAND controller 26 transmits the command "60h", the address ADD, and the command "DXh", each corresponding to the block BLK1 in the plane PLN0, to the memory chip 11. Upon receipt of the command "DXh", the sequencer 109 sets the ready/busy signal RBn to the "L" level, and sets the address ADD. Upon termination of setting of the address ADD, the sequencer 109 sets the ready/busy signal RBn to the "H" level.

Upon receipt of the ready/busy signal RBn at the "H" level, the NAND controller 26 transmits the command "A0h" and the erase voltage application set time period data ET to the memory chip 11. Next, the NAND controller 26 transmits the command "B0h" and the erase voltage application intensity data VS to the memory chip 11. Next, the NAND controller 26 transmits the command "DYh" to the memory chip 11.

Upon receipt of the command "DYh", the sequencer 109 sets the ready/busy signal RBn to the "L" level and initiates the erase voltage application operation on the blocks BLK0 and BLK1 of the plane PLN0. At this time, the erase voltage is set based on the erase voltage application intensity data VS.

Upon termination of the erase voltage application operation, the sequencer 109 sets the ready/busy signal RBn to the "H" level.

4.6 Advantageous Effect of Present Embodiment

The configuration of the present embodiment can attain the same effect as the first embodiment.

With the configuration of the present embodiment, furthermore, the erase target block information includes the erase voltage application intensity information. This enables setting of the erase voltage to be changed in the case in which the erase voltage application operation is executed again in the block BLK that has failed the erase verify with the erase voltage application accumulated time period having reached the erase voltage target time period. This improves efficiency of data erasure. Thus, a processing capability of the memory system 3 can be improved.

5. Fifth Embodiment

Next, a fifth embodiment will be described. In the fifth embodiment, the erase voltage application in the case in which the erase target block information contains the blocks BLK each different in the erase voltage application intensity will be described. Hereinafter, the matters different from the fourth embodiment will be mainly described.

5.1 Erase Target Block Information

An example of the erase target block information will be described with reference to FIG. 25. FIG. 25 is an example of the erase target block information table.

As shown in FIG. 25, for example, the erase voltage application accumulated time period and the erase voltage application intensity of the blocks BLK_ID0 and BLK_ID1 are respectively "TE" and "0". The erase voltage application accumulated time period "TE" is less than the erase verify permission time period "TB". Therefore, the blocks BLK_ID0 and BLK_ID1 are targeted for the erase voltage application operation. Furthermore, the erase voltage application accumulated time period and the erase voltage application intensity of the block BLK_ID2 are respectively "0" and "1". Therefore, the block BLK_ID2 is targeted for the erase voltage application operation.

For example, in the case where the plurality of blocks BLK each different in the erase voltage application intensity are present, the erase manager 23 selects the blocks BLK each equal in the erase voltage application intensity in a batch. For example, the erase manager 23 selects the blocks BLK in an ascending order of the erase voltage application intensity, as the block BLK targeted for the erase voltage application operation. More specifically, in the case shown in FIG. 25, the erase manager 23 first selects the blocks BLK_ID0 and BLK_ID1 each having the erase voltage application intensity of "0". After termination of the erase voltage application operation on each of the blocks BLK_ID0 and BLK_ID1, the erase manager 23 selects the block BLK_ID2 having the erase voltage application intensity of "1". At this time, for example, assume that the block BLK_ID0 fails the erase verify and has its erase voltage application intensity updated to "1". In this case, the erase manager 23 selects the blocks BLK_ID0 and BLK_ID2 each having the erase voltage application intensity of "1".

5.2 Advantageous Effect of Present Embodiment

The configuration of the present embodiment can attain the same effect as the fourth embodiment.

6. Modifications, Etc.

According to the above embodiments, the memory system includes: a nonvolatile memory including (10) a plurality of blocks (BLK) each including a plurality of memory cells (MC) and being a unit of erasure; and a memory controller (20) configured to cause the nonvolatile memory to execute an erase voltage application operation and an erase verify operation to erase data in at least one of the blocks. The memory controller is configured to: select a first block targeted for erasure from the plurality of blocks; make a comparison between a first erase voltage application accumulated time period and a first erase verify permission time period each corresponding to the first block; cause the nonvolatile memory to execute the erase voltage application operation in a case where the first erase voltage application accumulated time period is less than the first erase verify permission time period; and cause the nonvolatile memory to execute the erase verify operation in a case where the first erase voltage application accumulated time period is equal to or greater than the first erase verify permission time period.

The above embodiments can provide a memory system that can improve its processing capability.

The embodiments are not limited to those described in the above, and various modifications can be made.

For example, the fourth embodiment described the case in which the erase voltage application intensity information is included in the command set for the erase voltage application operation in order to change the setting of erase voltage; however, this case is not a limitation. For example, before transmission of the command set for the erase voltage application operation to the memory chip 11, the NAND controller 26 may transmit a command set regarding parameter setting of the memory chip 11 (also referred to as a "Set Feature").

For example, the above embodiments may be combined as far as possible.

Furthermore, the "coupling" in the above descriptions includes a state of being indirectly coupled, for example with a transistor, resistor, or any other component interposed in between.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory including a plurality of blocks each including a plurality of memory cells and being a unit of erasure; and
    circuitry programmed to transmit a first command set for an erase voltage application operation and a second command set for an erase verify operation to the nonvolatile memory, to erase data in at least one of the blocks,
    wherein the circuitry is programmed to:
    select a first block targeted for erasure from the plurality of blocks;
    make a comparison between a first erase voltage application accumulated time period and a first erase verify permission time period each corresponding to the first block;
    transmit the first command set to the nonvolatile memory to execute the erase voltage application operation in a case where the first erase voltage application accumulated time period is less than the first erase verify permission time period; and
    transmit the second command set to the nonvolatile memory to execute the erase verify operation in a case where the first erase voltage application accumulated time period is equal to or greater than the first erase verify permission time period, and
    the nonvolatile memory is programmed to execute the erase voltage application operation based on the first command set and to execute the erase verify operation based on the second command set.

2. The memory system according to claim 1, wherein the first command set for the erase voltage application operation includes an erase voltage application set time period.

3. The memory system according to claim 2, wherein the circuitry is programmed to determine the erase voltage application set time period based on a difference between a first erase voltage application target time period corresponding to the first block and the first erase voltage application accumulated time period.

4. The memory system according to claim 1, wherein the circuitry includes a timer and is programmed to:
    calculate an erase voltage application time period based on a measurement value of the timer after termination of the erase voltage application operation; and
    add the erase voltage application time period to the first erase voltage application accumulated time period.

5. The memory system according to claim 4, wherein the timer measures a time period during which a first signal received from the nonvolatile memory in execution of the erase voltage application operation is at a first logical level.

6. The memory system according to claim 1, wherein the circuitry is programmed to:
    further select a second block targeted for erasure from the plurality of blocks;
    make a comparison between a second erase voltage application accumulated time period and a second erase verify permission time period each corresponding to the second block; and
    transmit the first command set to the nonvolatile memory to execute the erase voltage application operation targeted for the first block and the second block in a case where the first erase voltage application accumulated time period is less than the first erase verify permission time period and the second erase voltage application accumulated time period is less than the second erase verify permission time period.

7. The memory system according to claim 6, wherein the nonvolatile memory further includes:
    a first plane including the first block and a first row decoder coupled to the first block; and
    a second plane including the second block and a second row decoder coupled to the second block.

8. The memory system according to claim 6, wherein the nonvolatile memory further includes a first plane including the first block, the second block, and a first row decoder coupled to the first block and the second block.

9. The memory system according to claim 6, wherein in a case of causing the nonvolatile memory to execute the erase voltage application operation targeted for the first block and the second block, the circuitry is programmed to:
    determine an erase voltage application set time period based on smaller one of a difference between a first erase voltage application target time period and the first erase voltage application accumulated time period corresponding to the first block and a difference between a second erase voltage application target time period and the second erase voltage application accumulated time period corresponding to the second block; and
    issue the first command set for the erase voltage application operation, including the erase voltage application set time period.

10. The memory system according to claim 1, wherein in a case where the erase verify operation on the first block indicates a failure, the circuitry is programmed to:
    update the first erase voltage application accumulated time period to an initial value; and
    transmit the first command set to the nonvolatile memory to execute the erase voltage application operation on the first block after updating the first erase voltage application accumulated time period.

11. The memory system according to claim 10, wherein in a case where the erase verify operation on the first block indicates a failure, the circuitry is programmed to:
    update erase voltage application set information; and
    transmit the first command set to the nonvolatile memory to execute the erase voltage application operation on the first block after updating the erase voltage application set information.

12. The memory system according to claim 1, wherein the circuitry is programmed to:
    further select a second block targeted for erasure from the plurality of blocks;
    make a comparison between first erase voltage application set information on the first block and second erase voltage application set information on the second block;
    in a case where the first erase voltage application set information and the second erase voltage application set information are different from each other, select one of the first block and the second block; and
    in a case where the first erase voltage application set information and the second erase voltage application set information are identical to each other, select the first block and the second block in a batch.

13. The memory system according to claim 1,
    wherein the first block further includes a plurality of string units each including the plurality of memory cells, and the circuitry is programmed to select at least one of first string units targeted for the erase verify operation from the plurality of string units in the erase verify operation.

14. The memory system according to claim 13, wherein in a case where the circuitry selects one of the first string units, the second command set for the erase verify operation includes an address of the selected one of the first string units.

15. The memory system according to claim 13, wherein in a case where the circuitry selects a plurality of the first string units, the second command set for the erase verify operation includes an address of one of the first string units from which the erase verify operation is initiated and information on a number of the selected first string units.

16. The memory system according to claim 13, wherein in a case where the erase verify operation indicates a pass, the circuitry is programmed to store information on a string unit which has passed the erase verify operation.

17. The memory system according to claim 1, wherein upon termination of the erase verify operation, the circuitry is programmed to read information based on a result of the erase verify operation from the nonvolatile memory.

\* \* \* \* \*